(12) United States Patent
Nishiyama et al.

(10) Patent No.: US 10,794,784 B2
(45) Date of Patent: Oct. 6, 2020

(54) SENSOR MODULE AND METHOD OF MAKING THE SAME

(71) Applicant: ROHM CO., LTD., Ukyo-ku, Kyoto (JP)

(72) Inventors: Yuto Nishiyama, Kyoto (JP); Taro Nishioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 231 days.

(21) Appl. No.: 15/830,815

(22) Filed: Dec. 4, 2017

(65) Prior Publication Data

US 2018/0172531 A1  Jun. 21, 2018

(30) Foreign Application Priority Data

Dec. 20, 2016  (JP) ................. 2016-246523

(51) Int. Cl.
 *G01L 9/00* (2006.01)
 *H05K 1/18* (2006.01)
 (Continued)

(52) U.S. Cl.
 CPC .......... *G01L 9/0048* (2013.01); *G01L 9/0054* (2013.01); *G01L 19/0084* (2013.01); *G01L 19/148* (2013.01); *H01L 24/00* (2013.01); *H05K 1/181* (2013.01); *H05K 3/22* (2013.01); *H05K 3/32* (2013.01); *G01C 5/06* (2013.01); *H01L 2224/04042* (2013.01); *H01L 2224/05554* (2013.01); *H01L 2224/32145* (2013.01); *H01L 2224/48091* (2013.01); *H01L 2224/48227* (2013.01); *H01L 2224/4917* (2013.01);
 (Continued)

(58) Field of Classification Search
 CPC ...... G01L 9/0048; G01L 19/148; H05K 1/181
 See application file for complete search history.

(56) References Cited

U.S. PATENT DOCUMENTS 5,721,446 A * 2/1998 Kobayashi ............ G01L 19/146
   257/419
9,013,013 B1 * 4/2015 Beer .................... G01L 19/0069
   257/415
(Continued)

FOREIGN PATENT DOCUMENTS

JP   2016039190 A  *  3/2016
JP   2016039190 A     3/2016

*Primary Examiner* — Jamel E Williams
(74) *Attorney, Agent, or Firm* — Hamre, Schumann, Mueller & Larson, P.C.

(57) ABSTRACT

The present invention provides a sensor module for preventing the corrosion of electrode pads and a method of manufacturing the same. The sensor module A1 includes: an electronic component 2, having a mounting surface 2a and an installation surface 2b facing opposite sides, wherein the mounting surface 2a is disposed with electrode pads 21; an atmospheric pressure sensor 3, having a main surface 3a and an installation surface 3b facing opposite sides, and a side surface 3c connecting the main surface 3a to the installation surface 3b, and mounted on the mounting surface 2a of the electronic component 2 with the installation surface 3b facing the electronic component 2; a bonding wire 4, connected to the electrode pads 21; and a protective member 5, covering the electrode pads 21. The protective member 5 exposes a portion of the bonding wire 4 and is in contact with the side surface 3c of the atmospheric pressure sensor 3.

26 Claims, 24 Drawing Sheets

(51) Int. Cl.
  *H05K 3/22*   (2006.01)
  *G01L 19/14*  (2006.01)
  *H05K 3/32*   (2006.01)
  *H01L 23/00*  (2006.01)
  *G01L 19/00*  (2006.01)
  *G01C 5/06*   (2006.01)

(52) U.S. Cl.
  CPC ............ *H01L 2224/49113* (2013.01); *H01L 2224/73265* (2013.01); *H01L 2224/8592* (2013.01); *H01L 2224/97* (2013.01); *H01L 2924/16151* (2013.01); *H01L 2924/16152* (2013.01)

(56) References Cited

U.S. PATENT DOCUMENTS

2009/0293618 A1* 12/2009 Tamura ................... G01P 1/006
                                               73/514.33
2015/0131244 A1*  5/2015 Ballandras ........... G01K 11/265
                                               361/760

* cited by examiner

SENSOR MODULE AND METHOD OF MAKING THE SAME

BACKGROUND

1. Field of the Invention

The present disclosure relates to sensor modules and methods of making the same.

2. Description of Related Art

Microtechnology for use in the manufacturing of semiconductor integrated circuits has been applied in integrating mechanical components and electronic circuits to produce devices called micro electro mechanical systems (MEMS). Patent literature 1 discloses a sensor module in which a sensor comprised of a MEMS is mounted in a semiconductor package having a hollow structure.

When the sensor module is used to detect temperature, atmospheric pressure or humidity, it is configured to include an opening for collecting gas from the external environment. In such configurations, contaminants such as salt water might enter the sensor through the opening. When this occurs, the electrode pad connected with the bonding wire may be corroded by the salt water or other contaminants, resulting in, for example, the separation of the bonding wire from the electrode pad.

PRIOR TECHNICAL LITERATURE

Patent Literature

[Patent literature 1] The specification of Japan patent application publication No. 2016-39190.

BRIEF SUMMARY OF THE INVENTION

Problems to be Solved in the Present Invention

One object of the present invention is to address the above-mentioned issue by providing a sensor module for inhibiting the corrosion of electrode pads and a method of making such sensor module.

Technical Means for Solving Problems

In the first aspect, the present invention provides a sensor module that comprises: a substrate having a substrate main surface and a substrate back surface facing opposite sides, wherein the substrate main surface is disposed with electrodes; a sensor having a sensor main surface and a sensor back surface facing opposite sides, and a sensor side surface connecting the sensor main surface and the sensor back surface, wherein the sensor is mounted on the substrate main surface with the sensor back surface facing the substrate; a bonding wire connected to the electrodes; and a protective member covering the electrodes, wherein the protective member exposes a portion of the bonding wire and is in contact with the sensor side surface.

In preferred embodiments of the present invention, the protective member continuously covers from the electrodes to a maximum curvature portion of the bonding wire.

In preferred embodiments of the present invention, the sensor comprises a support portion having a recess, and a cover covering an opening of the support portion.

In preferred embodiments of the present invention, the protective member covers at least a portion of a junction between the support portion and the cover.

In preferred embodiments of the present invention, the protective member exposes at least a portion of the sensor main surface.

In preferred embodiments of the present invention, the sensor comprises a circuit formed on the sensor main surface, and the protective member exposes the circuit.

In preferred embodiments of the present invention, the sensor comprises a hollow portion, and the protective member exposes at least a region of the sensor main surface where the hollow portion is located, when being viewed from the top.

In preferred embodiments of the present invention, the protective member comprises a portion between the substrate main surface and the sensor back surface.

In preferred embodiments of the present invention, there is a plurality of sensor side surfaces, and the protective member covers a portion of each of at least two consecutive sensor side surfaces.

In preferred embodiments of the present invention, the protective member comprises a mountain-shaped portion, in which the mountain-shaped portion protrudes along the bonding wire in a direction away from the electrodes of the substrate.

In preferred embodiments of the present invention, the substrate comprises four substrate side surfaces connecting the substrate main surface and the substrate back surface, the sensor is mounted proximal to two consecutive substrate side surfaces with respect to a center of the substrate main surface, and a plurality of electrodes are disposed on the substrate main surface in an electrode arranging region proximal to two consecutive substrate side surfaces different from the two substrate side surfaces, and the protective member covers the electrode arranging region.

In preferred embodiments of the present invention, the protective member comprises silicone resin.

In preferred embodiments of the present invention, the sensor module further comprises a bonding member bonding the substrate and the sensor, and the protective member comprises the same material as the bonding member.

In preferred embodiments of the present invention, the electrodes comprise aluminum or aluminum alloy.

In preferred embodiments of the present invention, the substrate is an electronic component.

In preferred embodiments of the present invention, the sensor module further comprises a second substrate, the second substrate includes a second substrate main surface and a second substrate back surface facing opposite sides, and the second substrate main surface is disposed with second electrodes; and the substrate is mounted on the second substrate main surface.

In preferred embodiments of the present invention, the second substrate comprises four second substrate side surfaces connecting the second substrate main surface and the second substrate back surface, the substrate is mounted proximal to two consecutive second substrate side surfaces with respect to a center of the second substrate main surface, and a plurality of second electrodes are provided on the second substrate main surface in a second electrode arranging region proximal to two consecutive second substrate side surfaces different from the two second substrate side surfaces.

In preferred embodiments of the present invention, the protective member continuously covers the second substrate main surface.

In preferred embodiments of the present invention, the sensor module further comprises a second protective member covering the second electrodes.

In preferred embodiments of the present invention, the sensor module further comprises an electronic component mounted on the substrate main surface.

In preferred embodiments of the present invention, the sensor comprises third electrodes formed on the sensor main surface, and the sensor module further comprises a third protective member covering the third electrodes.

In preferred embodiments of the present invention, the sensor module further comprises a second cover, wherein the second cover is arranged in a box shape and surrounds the sensor, the bonding wire, and the protective member.

In preferred embodiments of the present invention, the second cover is provided with an opening portion.

In preferred embodiments of the present invention, there is a plurality of electrodes, and at least the electrode that appears closest to the opening portion, when viewed from top, is covered by the protective member.

In preferred embodiments of the present invention, the second cover comprises metal.

In preferred embodiments of the present invention, the sensor is an atmospheric pressure sensor.

In a second aspect, the present invention provides a method of making a sensor module, in which the method comprises the steps of: a first step of preparing a sheet substrate having a main surface and a back surface facing opposite sides, wherein the main surface is provided with a substrate electrode; a second step of mounting an electronic component provided with an electronic component electrode on the main surface of the sheet substrate; a third step of connecting the substrate electrode and the electronic component electrode with a bonding wire; a fourth step of mounting a sensor on a surface of the electronic component opposite to the sheet substrate, wherein the sensor comprises a sensor main surface and a sensor back surface facing opposite sides and a sensor side surface connecting the sensor main surface and the sensor back surface, and the sensor main surface is provided with a sensor electrode; a fifth step of forming a protective member by applying a silicone paste to cover the electronic component electrode and to contact the sensor side surface, and curing the silicone paste; a sixth step of connecting the sensor electrode and the substrate electrode with a bonding wire; and a seventh step of fixing a box-shaped cover to the main surface of the sheet substrate to surround the electronic component, the sensor, the bonding wires, and the protective member.

Effects of the Present Invention

According to the present invention, the corrosion of the electrodes can be prevented.

Other features and advantages of the present invention will be apparent based on reading the following detailed description in connection with the appended drawings.

DETAILED DESCRIPTION

The present invention is described herein based on preferred embodiments and by referencing the appended drawings. Embodiments for implementing the present invention (hereinafter, "embodiment of the present invention") are described in connection with the appended drawings using the atmospheric pressure sensor as an example.

The First Embodiment of the Present Invention

Figure 1:
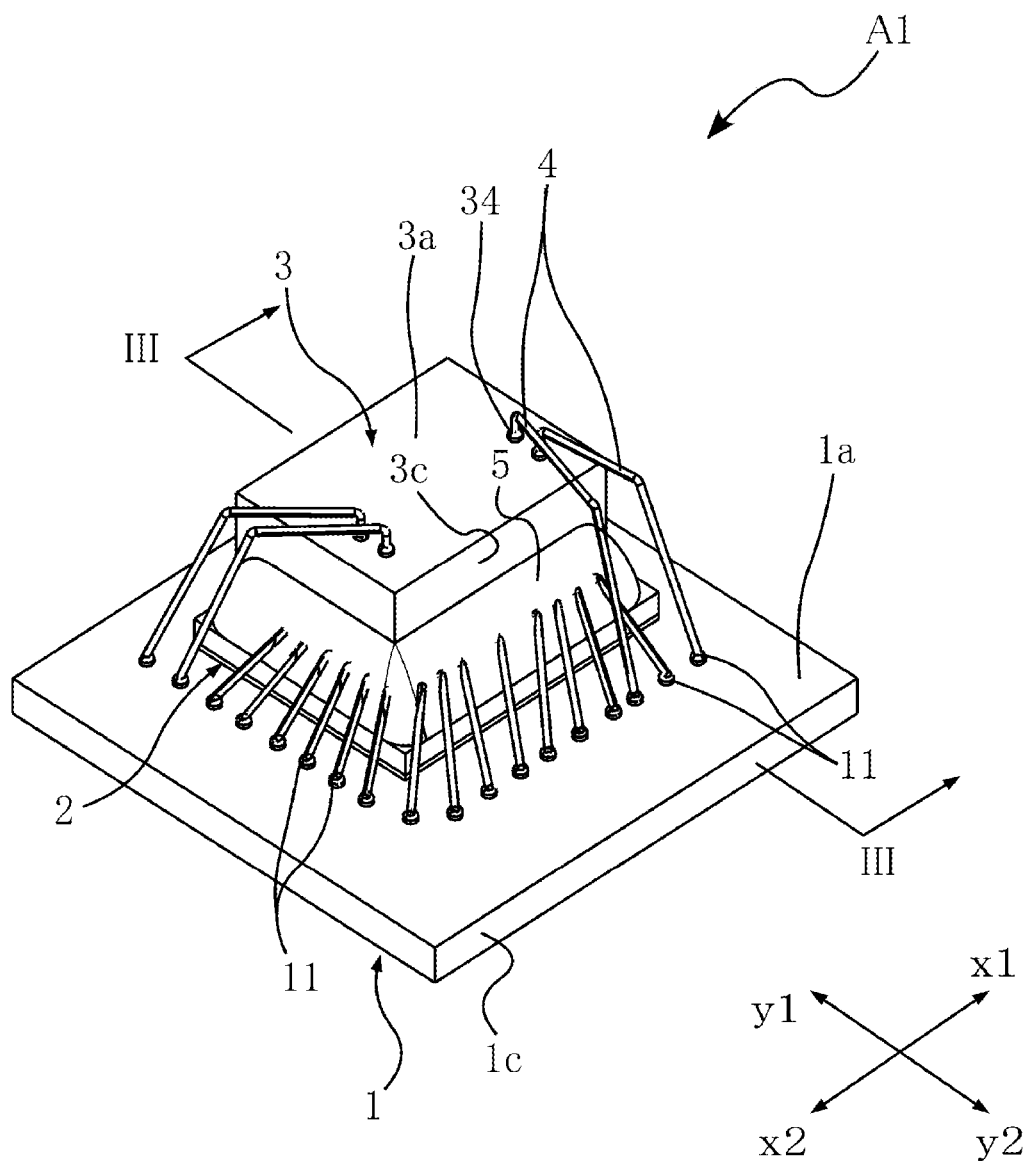
FIG. 1 is a perspective view of a sensor module according to a first embodiment of the present invention.
Figure 2:
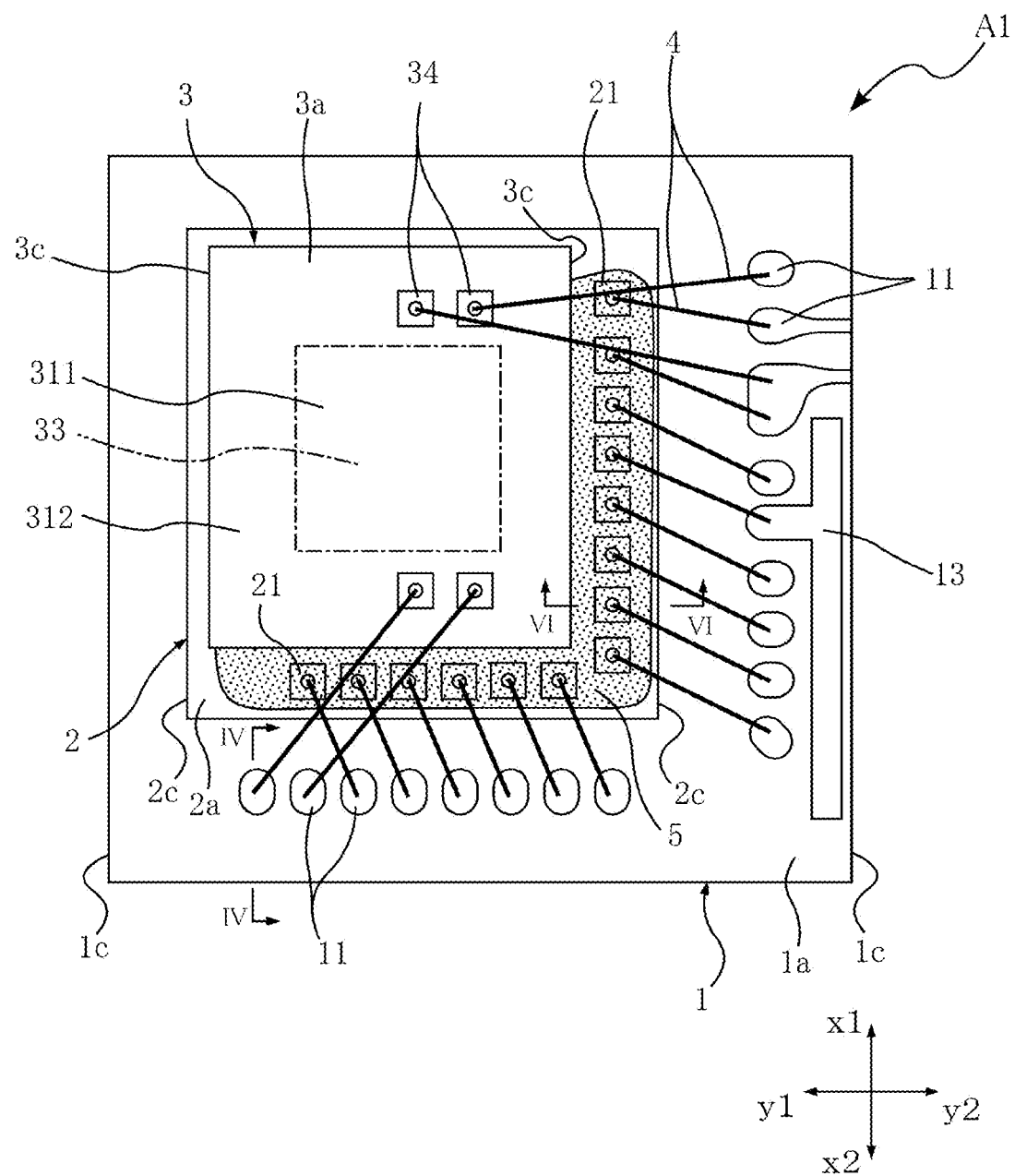
FIG. 2 is a top view of the sensor module in FIG. 1.
Figure 3:
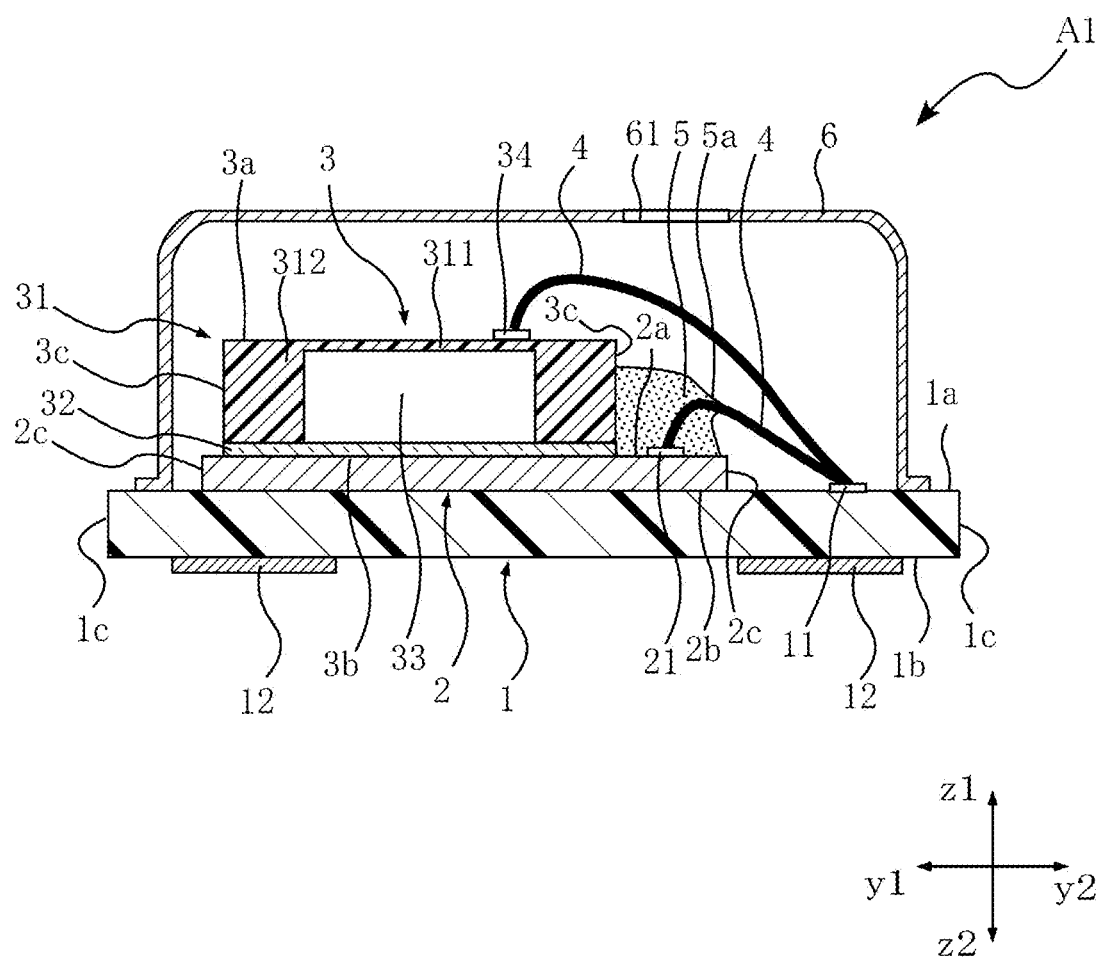
FIG. 3 is a cross-sectional view taken along line in FIG. 1.
Figure 4:
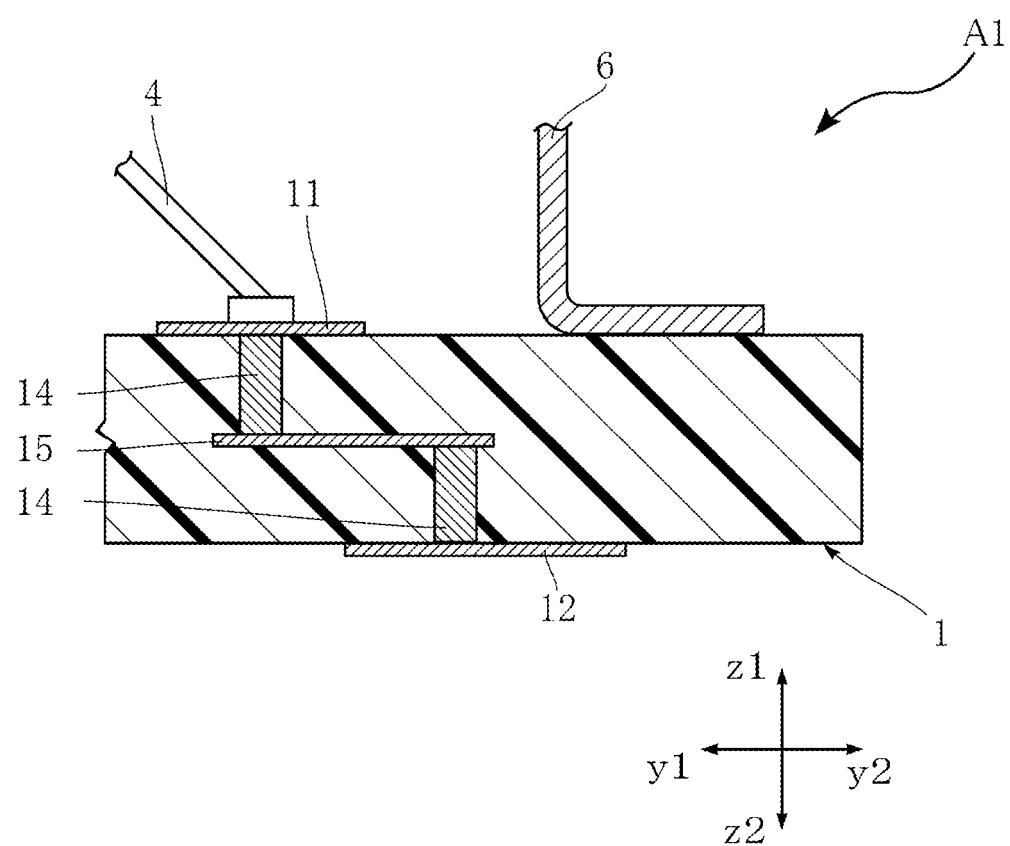
FIG. 4 is an enlarged cross-sectional view of the main portion taken along line IV-IV in FIG. 2.
Figure 5:
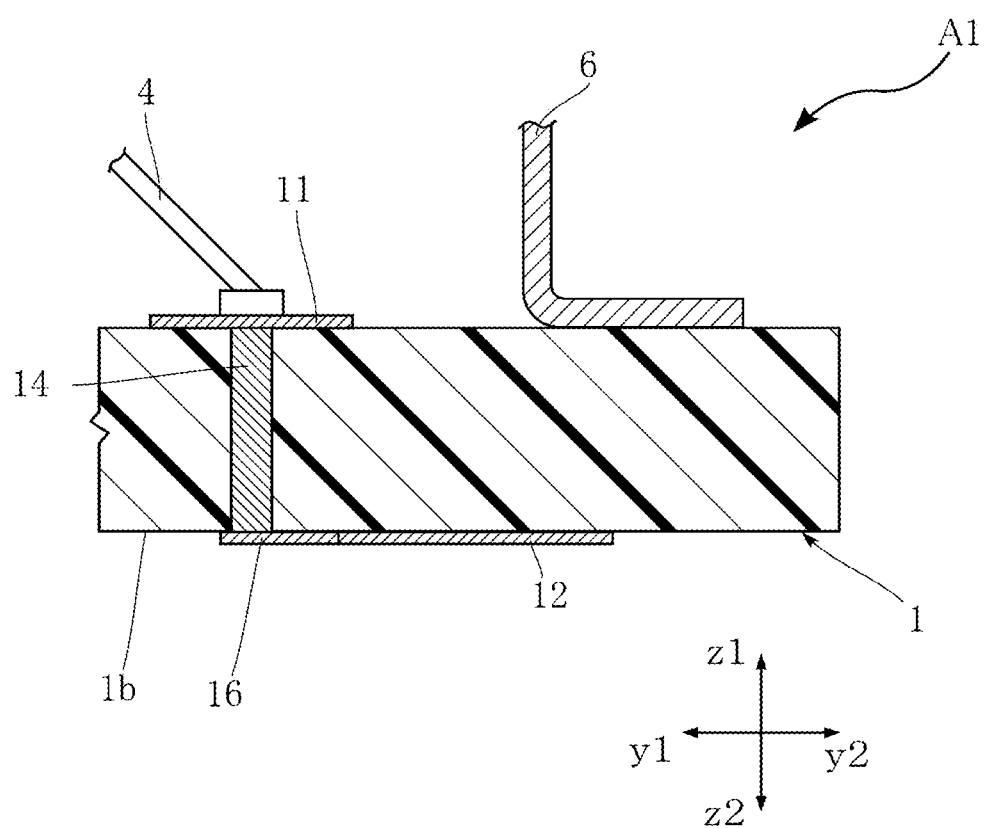
FIG. 5 illustrate a sensor module according to another example of the first embodiment of the present invention, and corresponds to FIG. 4.
Figure 6:
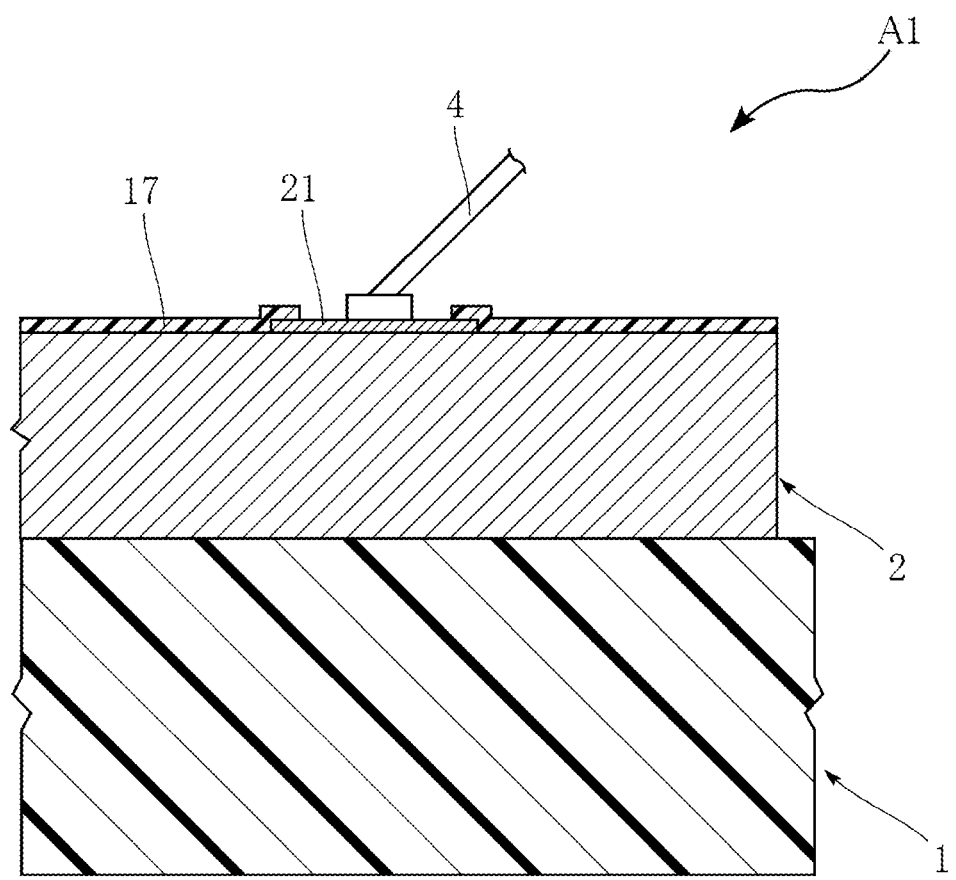
FIG. 6 is an enlarged cross-sectional view of the main portion taken along line VI-VI in FIG. 2.
Figure 7:
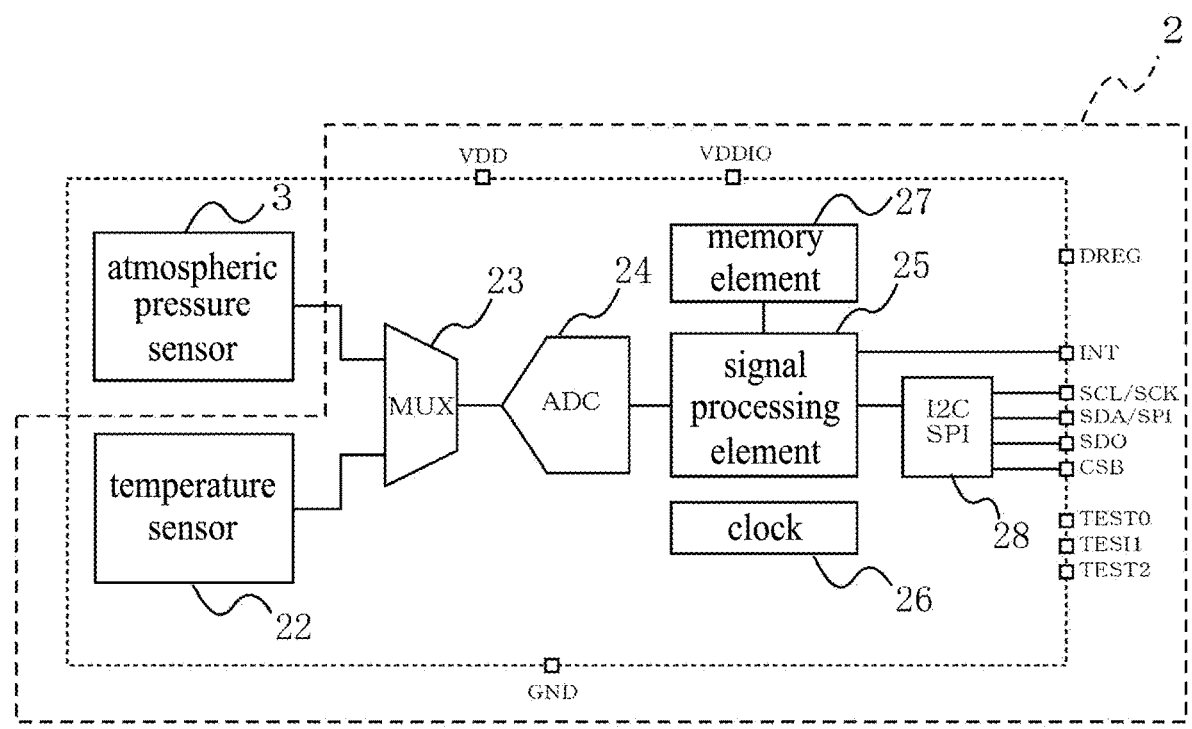
FIG. 7 is a block diagram of the sensor module in FIG. 1.

A sensor module A1 according to the first embodiment of the present invention is described with reference to FIG. 1 to FIG. 9. FIG. 1 is a perspective view illustrating the sensor module A1. FIG. 2 is a top view of the sensor module A1. FIG. 3 is a cross-sectional view taken along line III-III in FIG. 1. FIG. 4 is an enlarged cross-sectional view of the main portion taken along line IV-IV in FIG. 2. FIG. 5 illustrates another example of the sensor module A1, and corresponds to FIG. 4. FIG. 6 is an enlarged cross-sectional view of the main portion taken along line VI-VI in FIG. 2. FIG. 7 is a block diagram of the sensor module A1. To facilitate understanding, the cover 6 described below is omitted from FIG. 1 and FIG. 2, and FIG. 2 and FIG. 3 illustrate the protective member 5. Further, in FIG. 3, portions of the electrode pad and the bonding wire are omitted. Also, in FIG. 6, the protective member 5 described below is omitted. In these drawings, the thickness direction of the sensor module A1 (in the top view direction) is defined as the z direction (z1-z2 direction), and the direction that is perpendicular to the z direction and along one side of the sensor module A1 is defined as the x direction (x1-x2 direction), and the direction that is perpendicular to both the z direction and the x direction is defined as the y direction (y1-y2 direction); these drawings are described accordingly and the same also applies to the subsequent drawings. In this embodiment of the present invention, the size of sensor module A1 in the x direction and y direction is, for example, about 2 mm, whereas the size in the z direction is about 0.8 to 1 mm.

The sensor module A1 illustrated in the drawings is used for detecting the atmospheric pressure; for example, it is installed on the circuit board of various electronic devices such as a mobile terminal. For example, in the mobile terminal, the sensor module A1 is used to sense the atmospheric pressure. The determined atmospheric pressure can be used as the information for calculating altitude. As illustrated in FIG. 1 to FIG. 3, the sensor module A1 comprises a substrate 1, an electronic component 2, an atmospheric pressure sensor 3, a bonding wire 4, a protective member 5, and a cover 6.

As illustrated in FIG. 1 to FIG. 3, the substrate 1 is configured to bear the electronic component 2, and to serve as a member by which to install the sensor module A1 on a circuit board of various electronic devices. The substrate 1 can be a printed circuit board, wherein a wiring pattern is formed on an electrically insulating base. Examples of materials of the base include, but are not limited to, glass epoxy resin, polyimide resin, phenol resin, and ceramics. The substrate 1, when viewed from the top, is a plate that is rectangular in shape, and includes a mounting surface 1a, an installation surface 1b, and a side surface 1c. The mounting surface 1a and the installation surface 1b face opposite sides in the thickness direction (z direction) of the substrate 1. The mounting surface 1a faces the z1 direction, and is configured to bear the electronic component 2. The installation surface 1b faces the z2 direction, and is configured to install the sensor module A1 on the circuit board of various electronic devices. The side surface 1c connects with the mounting surface 1a and the installation surface 1b, faces the x direction or y direction, and is parallel to the z direction. In the present embodiment, the size of the substrate 1 in the z direction is about 100 to 200 μm, and the sizes in the x direction and y direction are about 2 mm, respectively. The "substrate 1" corresponds to the "second substrate" of the present invention. In addition, the "mounting surface 1a," the "installation surface 1b," and the "side surface 1c" respectively correspond to the "second substrate main surface," the "second substrate back surface," and the "second substrate side surface."

Electrode pads 11 are disposed on the mounting surface 1a of the substrate 1. The electrode pads 11 are used as electrodes for the conductive connection between the electronic component 2 and the atmospheric pressure sensor 3, when installing the electronic component 2 and the atmospheric pressure sensor 3 on the mounting surface 1a. The electrode pads 11 are connected to the bonding wire 4. The electrode pads 11 comprise one or more metals of, for example, Cu, Ni, Ti, Au, etc., and are formed by, for example, plating. The electrode pads 11 are arranged along the y2 side and the x2 side of the electronic component 2. The "electrode pads 11" correspond to the "second electrodes" and the "substrate electrodes."

Moreover, electrode pads 12 are disposed on the installation surface 1b of the substrate 1. The electrode pads 12 are used as electrodes for the conductive connection with the wiring pattern of the circuit board when installing the sensor module A1 on the circuit board. The electrode pad 12 comprises one or more metals of, for example, Cu, Ni, Ti, Au, etc., and are formed by, for example, plating. Some of the electrode pads 11 are connected to the wiring pattern 13 of the mounting surface 1a (see, FIG. 2), while, as illustrated in FIG. 4, some of the electrode pads 11 are connected to the electrode pads 12 of the installation surface 1b. Moreover, in FIG. 2, only a portion of the wiring pattern 13 is depicted. In FIG. 4, the electrode pad 11 is connected to the electrode pad 12 via a through wiring 14 and a mid-layer wiring 15. The through wiring 14 is a conductive path extending within the substrate 1 along the z direction. The mid-layer wiring 15 forms a conductive path extending within the substrate 1 along the x direction and the y direction. It is also feasible to utilize the configuration depicted in FIG. 5, in which a wiring pattern 16 that is connected to the electrode pad 12 is disposed on the installation surface 1b, so that the electrode pad 11 is connected to the wiring pattern 16 via the through wiring 14, thereby connecting the electrode pad 11 to the electrode pad 12.

The electronic component 2 is configured to process the electric signal detected by the sensor, and is a so-called application specific integrated circuit (ASIC) component. As illustrated in FIG. 7, in the present embodiment, the electronic component 2 comprises a temperature sensor 22, and is configured to process the electric signal detected by the temperature sensor 22 and the electric signal detected by an atmospheric pressure sensor 3. The electronic component 2 multiplexes the electric signal detected by the temperature sensor 22 and the electric signal detected by the atmospheric pressure sensor 3 using a multiplexer 23, and converts them into digital signals using an analog/digital converting circuit 24. Next, a signal processing element 25 uses the memory region of a memory element 27 and amplifies, filters or performs the logical operation based on the clock signal of a clock 26. The processed signal is outputted via an interface 28. In this way, the sensor module A1 may appropriately process the signal obtained from the detection of the atmospheric pressure and temperature appropriately before outputting the signal.

The electronic component 2 is a packaged control electronic component that bears various components on the substrate. The electronic component 2, when viewed from the top, is a plate that is rectangular in shape, and comprises a mounting surface 2a, an installation surface 2b, and a side surface 2c. The mounting surface 2a and the installation surface 2b face opposite sides in the thickness direction (z direction) of the electronic component 2. The mounting surface 2a faces the z1 direction, and is configured to bear an atmospheric pressure sensor 3. The installation surface 2b faces the z2 direction, and is configured to install the electronic component 2 on the substrate 1. The side surface 2c connects to the mounting surface 2a and the installation surface 2b, faces the x direction or the y direction, and is parallel to the z direction. In the present embodiment, the size of the electronic component 2 in the z direction is about 80 μm, and the sizes in the x direction and the y direction are about 1 to 1.2 mm, respectively. The "electronic component 2" corresponds to the "substrate" according to the present invention. In addition, the "mounting surface 2a," the "installation surface 2b," and the "side surface 2c" respectively correspond to the "substrate main surface," the "substrate back surface," and the "substrate side surface," according to the present invention.

The electronic component 2 is mounted on the mounting surface 1a of the substrate 1 at a position that is proximal to or offset in the x1 direction and the y1 direction with respect to a center of the mounting surface 1a. The installation surface 2b of the electronic component 2 and the mounting surface 1a of the substrate 1 are connected with a die attachment film or the like (not shown in the Figures).

Electrode pads 21 are disposed on the mounting surface 2a of the electronic component 2. The electrode pads 21 are used as electrodes for the conductive connection with the electrode pads 11 of the substrate 1. The electrode pads 21 comprise, for example, aluminum or aluminum alloy, and are formed by, for example, plating. The electrode pads 21 are connected to the conductive path within the electronic component 2, and are arranged along the y2 side and x2 side of the atmospheric pressure sensor 3. As illustrated in FIG. 6, the periphery of the electrode pad 21 is covered by a protective film 17, while the inner part of the electrode pad 21 is exposed. The exposed part is connected to the bonding wire 4. The "electrode pad 21" corresponds to the "electrodes" and "the electronic component electrodes" according to the present invention.

The atmospheric pressure sensor 3 is a sensor configured to detect the atmospheric pressure. The atmospheric pressure sensor 3 detects the atmospheric pressure, and outputs the detection results to the electronic component 2 in the form of an electric signal. The atmospheric pressure sensor 3 is a cuboid, and comprises a main surface 3a, an installation surface 3b, and a side surface 3c. The main surface 3a and the installation surface 3b face opposite sides in the thickness direction (the z direction) of the atmospheric pressure sensor 3. The main surface 3a faces the z1 direction. The installation surface 3b faces the z2 direction, and is configured to install the atmospheric pressure sensor 3 on the electronic component 2. The side surface 3c connects to the main surface 3a and the installation surface 3b, faces the x direction or the y direction, and is parallel to the z direction. In the present embodiment, the size of the atmospheric pressure sensor 3 in the z direction is about 30 to 40 μm, whereas the sizes in the x direction and the y direction are respectively about 0.7 to 1 mm. As illustrated in FIG. 3, the atmospheric pressure sensor 3 comprises a silicon substrate 31 and a glass substrate 32. The "atmospheric pressure sensor 3" corresponds to the "sensor" according to the present invention. The "main surface 3a," the "installation surface 3b," and the "side surface 3c" respectively correspond to the "sensor main surface," the "sensor back surface," and the "sensor side surface," according to the present invention. The "silicon substrate 31" corresponds to the "support portion" according to the present invention, while the "glass substrate 32" corresponds to the "cover" according to the present invention.

The silicon substrate 31 is box-shaped, formed by silicon deposition, and comprises a diaphragm 311 and a support layer 312 supporting the periphery of the diaphragm 311. The silicon substrate 31 is formed by etching the deposited silicon substrate with a specific etching mask. The thin film portion formed by etching becomes the diaphragm 311. The term "thin film" means that the thickness thereof is at least thinner than the thickness of the support layer 312 (i.e., the size in the z direction), and is deformable due to the difference between the atmospheric pressure within a chamber 33 and the atmospheric pressure outside the chamber 33.

Moreover, the method for making the silicon substrate 31 is not limited to a specific method, as long as the method can form the thin film diaphragm 311. In the present embodiment, the thickness of the diaphragm 311 (i.e., the size in the z direction) is about 7 μm.

The glass substrate 32 is fixed to the support layer 312 by blocking the opening portion formed on the silicon substrate 31. The glass substrate 32 and the silicon substrate 31 are bonded by, for example, anodic bonding. Moreover, the glass substrate 32 and the silicon substrate 31 can be bonded by any other suitable bonding methods (such as using an adhesive). The space surrounded by the diaphragm 311, the support layer 312, and the glass substrate 32 is a closed space, and becomes the chamber 33 in which the pressure remains constant. In the present embodiment, the chamber 33 is brought to a vacuum state close to absolute vacuum. Also, in the present embodiment, the diaphragm 311 is set to be rectangular when viewed from the top, and the chamber 33 is set to be a cuboid space (in FIG. 2, the dash/dot line represents the chamber 33 that is hidden from view). Moreover, the shapes of the diaphragm 311 and the chamber 33 are not limited. For example, the diaphragm 311 can be set to have a circular shape in the top view. In such case, the chamber 33 is cylindrical in shape. The "chamber 33" corresponds to the "hollow portion" according to the present invention.

The atmospheric pressure sensor 3 generates an electric signal that corresponds to the deformed shape of the diaphragm 311 (the strain condition) due to the difference between the atmospheric pressure within the chamber 33 and the atmospheric pressure outside the chamber 33, and outputs the electric signal to the electronic component 2.

Figure 8:
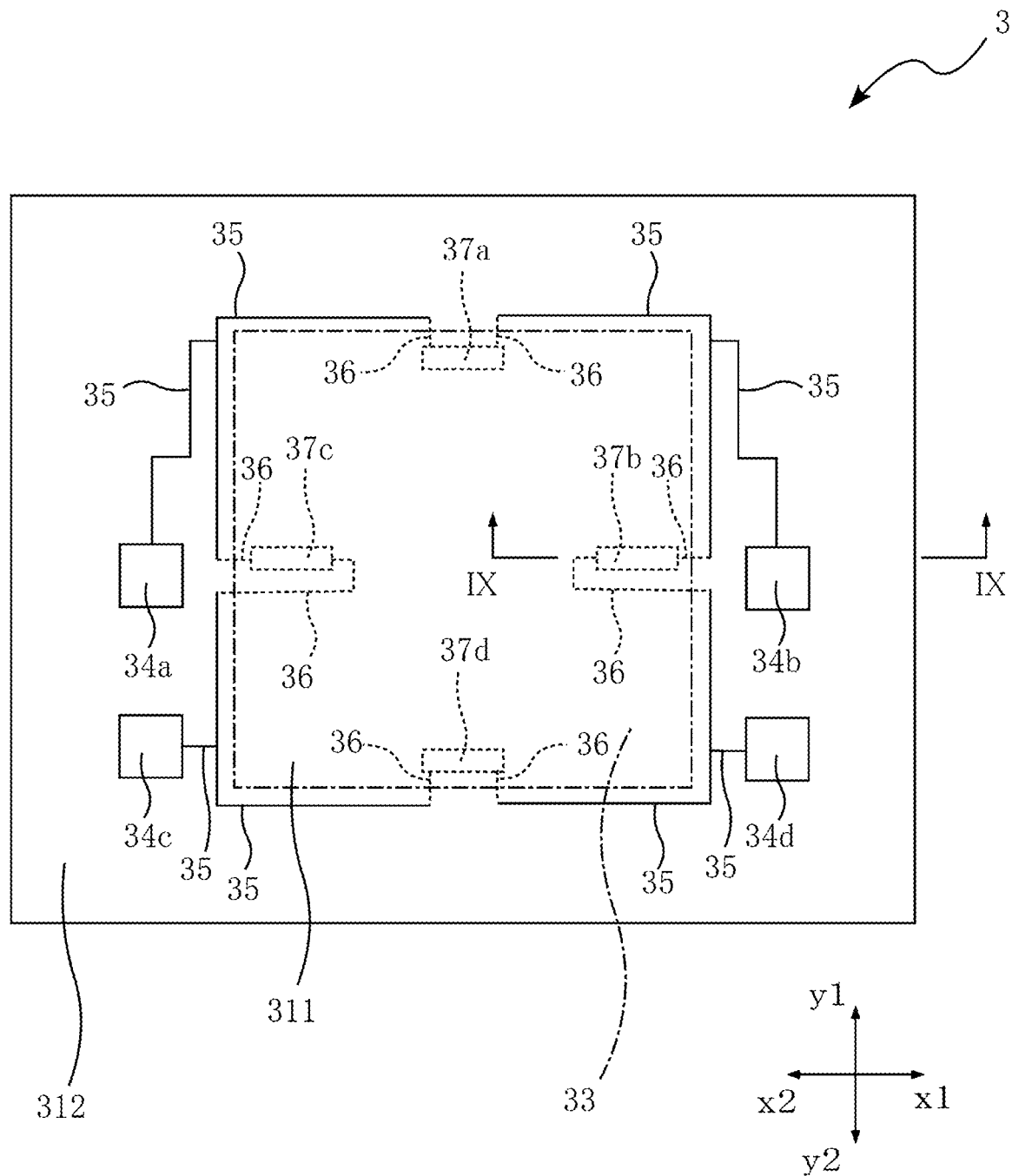
FIG. 8 is a top view of an atmospheric pressure sensor according to the first embodiment of the present invention and illustrates an example of the layout drawing.
Figure 9:
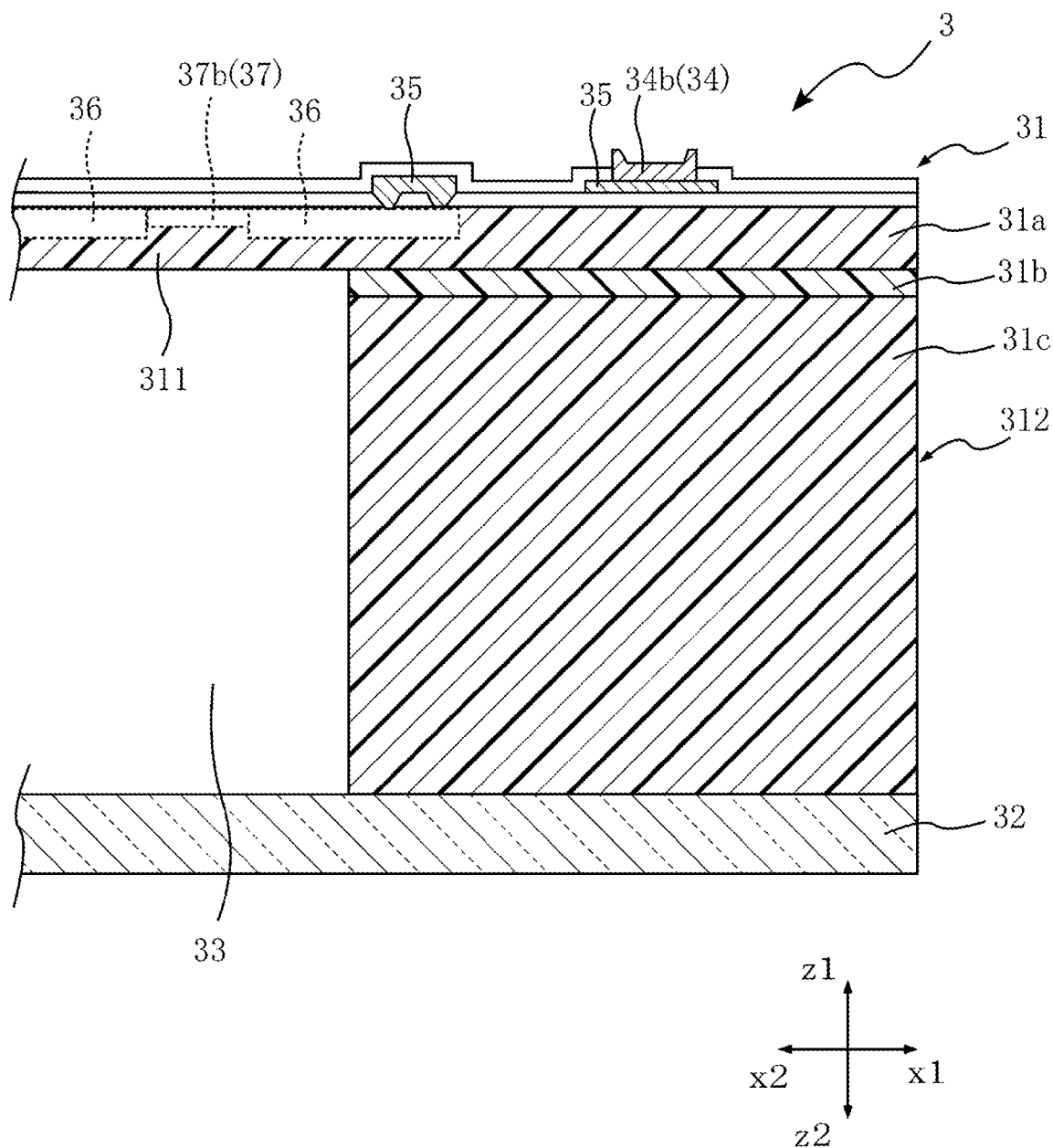
FIG. 9 is a cross-sectional view taken along line IX-IX in FIG. 8.

FIG. 8 is a top view of an atmospheric pressure sensor 3 that illustrates an example of the layout. FIG. 9 is a cross-sectional view taken along line IX-IX in FIG. 8.

As illustrated in FIG. 9, the silicon substrate 31 is formed by etching the silicon substrate, formed by depositing an oxide layer 31b between the silicon layer 31a and the silicon layer 31c, from the x2 direction until the oxide layer 31b. The remaining silicon layer 31a becomes the diaphragm 311. Also, on the surface of the silicon layer 31a in the x1 direction, a diffusion resistor 37 is formed by the diffusion of impurities, and a diffusion wiring 36 is formed by the diffusion of impurities. The diffusion resistor 37 is formed at the diaphragm 311, and is a gauge resistor with a resistance level that varies according to the deformation of the diaphragm 311. Also, at the surface of the silicon layer 31a in the x1 direction, a metal wiring 35 is formed by sputtering, and electrode pads 34 are formed at specific positions of the metal wiring 35. In FIG. 8, the diffusion resistor 37 and the diffusion wiring 36 are indicated using dashed lines. The "electrode pad 34" corresponds to the "third electrodes" and the "sensor electrodes" according to the present invention.

As illustrated in FIG. 8, four diffusion resistors 37a, 37b, 37c, and 37d are disposed within the diaphragm 311 of the atmospheric pressure sensor 3. The four diffusion resistors 37a, 37b, 37c, and 37d are connected with the metal wiring 35 and the diffusion wiring 36, and constitute a bridge circuit. Also, four electrode pads 34a, 34b, 34c, and 34d are disposed at the periphery of the diaphragm 311 of the atmospheric pressure sensor 3. The electrode pad 34a is connected to the metal wiring 35 connecting the diffusion resistor 37a and the diffusion resistor 37c. The electrode pad 34b is connected to the metal wiring 35 connecting the diffusion resistor 37a and the diffusion resistor 37b. The electrode pad 34c is connected to the metal wiring 35 connecting the diffusion resistor 37c and the diffusion resistor 37d. The electrode pad 34d is connected to the metal wiring 35 connecting the diffusion resistor 37b and the diffusion resistor 37d. A reference voltage of, for example, 5 V, is applied between the electrode pad 34a and electrode pad 34d, and the voltage between the electrode pad 34b and electrode pad 34c is outputted to the electronic component 2 in the form of an electric signal. The diffusion resistor 37b and the diffusion resistor 37c extend along the current flow direction (the long side direction in FIG. 8) with the strain of the diaphragm 311, and hence, the resistance increases. On the other hand, the diffusion resistor 37a and the diffusion resistor 37d extend along the direction that is perpendicular to the current flow direction (the short side direction in FIG. 8) with the strain of the diaphragm 311, and hence, the resistance level decreases. In this way, the voltage between the electrode pad 34b and electrode pad 34c varies in response to the strain condition of the diaphragm 311. Moreover, FIG. 8 is only an example for the wiring pattern. There is no limitation to the arrangement and connection of the electrode pads 34a, 34b, 34c and 34d, the diffusion resistors 37a, 37b, 37c and 37d, the diffusion wiring 36, and the metal wiring 35.

As illustrated in FIG. 1 to FIG. 3, the atmospheric pressure sensor 3 is mounted at a position that is offset in (or proximal to) the x1 direction and the y1 direction with respect to a center of the mounting surface 2a of the electronic component 2. The atmospheric pressure sensor 3 and the electronic component 2 are bonded using a bonding member, such as a silicone resin (not shown in the drawing). The electrode pads 34 (34a, 34b, 34c, and 34d) of the atmospheric pressure sensor 3 are conductively connected to the electrode pads 11 of the substrate 1. The electrode pads 34 are bonded with the bonding wire 4. The electrode pads 34 comprise, for example, metal such as aluminum or aluminum alloy. Each electrode pad 34 is electrically connected to the electrode pad 21 of the electronic component 2 via the electrode pad 11 of the substrate 1 and the wiring pattern. Moreover, the electrode pad 34 of the atmospheric pressure sensor 3 can be connected to the electrode pad 21 of the electronic component 2 using the bonding wire 4.

The bonding wire 4 is configured to conduct the electrode pads 11 of the substrate 1 to the electrode pad 21 of the electronic component 2 or the electrode pads 34 of the atmospheric pressure sensor 3, and can be formed by a metal, such as Au. Moreover, the material for forming the bonding wire 4 is not limited; for example, the material can be Al, Cu, etc. One end of the bonding wire 4 is connected to the electrode pad 11, and the other end of the bonding wire 4 is connected to the electrode pad 21 or the electrode pad 34.

The protective member 5 covers the electrode pad 21 of the electronic component 2. In the present embodiment, the atmospheric pressure sensor 3 is disposed at a position that is offset in (or proximal to) the x1 direction and the y1 direction with respect to a center of the mounting surface 2a of the electronic component 2; and the electrode pads 21 of the electronic component 2 are arranged on the mounting surface 2a in such a way that, when viewed from above, appear spaced apart from the atmospheric pressure sensor 3. That is, the electrode pads 21 are arranged on the mounting surface 2a at a region at the side of the x2 direction of the atmospheric pressure sensor 3 and a region at the side of the y2 direction of the atmospheric pressure sensor 3. The protective member 5 continuously covers each electrode pad 21 (see FIG. 2). The protective member 5 is formed by connecting with the side surface 3c of the atmospheric pressure sensor 3, at least from the joint surface of the silicon substrate 31 and the glass substrate 32 to the z1 direction side (see, FIG. 3). In addition, the protective member 5 continuously covers from the electrode pad 21 that is bonded with the bonding wire 4 to a maximum curvature portion of the bonding wire 4 (see FIG. 3).

The protective member 5 comprises, for example, silicone resin, and is formed by applying a silicone paste and curing the silicone paste. Moreover, the protective member 5 may comprise any insulating resin, such as epoxy resin or acrylic resin. The protective member 5 may not be completely solid; for example, it can be a semisolid, such as grease. The silicone paste (i.e., the protective member 5 prior to curing) is flowable, and flows into the gap between the installation surface 3b of the atmospheric pressure sensor 3 and the mounting surface 2a of the electronic component 2. Therefore, the protective member 5 comprises a portion disposed between the installation surface 3b of the atmospheric pressure sensor 3 and the mounting surface 2a of the electronic component 2. Also, the protective member 5 comprises a mountain-shaped portion 5a. The mountain-shaped portion 5a is formed by surface tension and protrudes along the bonding wire 4 in a direction away from the electrode pad 21.

The cover 6 is a box-shaped member made from metal, is fixed to the mounting surface 1a of the substrate 1, and surrounds the electronic component 2, the atmospheric pressure sensor 3, the bonding wire 4, and the protective member 5. Moreover, the cover 6 may comprise a material other than metal. The method of making the cover 6 is not limited. The space between the cover 6 and the substrate 1 is not filled with resin, thereby resulting in a hollow structure. Further, the cover 6 includes an opening portion 61 for collecting gas from the external environment. The atmospheric pressure sensor 3 detects, through the opening portion 61 and the hollow structure, the ambient pressure (i.e., the atmospheric pressure) around the sensor module A1. The temperature sensor of the electronic component 2 detects the ambient temperature around the sensor module A1. In the present embodiment, only one opening portion 61 is disposed at the electrode pad 21 of the electronic component 2 in the z1 direction (see, FIG. 3). However, the number of opening portions 61 is not limited.

The method of making the sensor module A1 will now be described in connection with FIG. 10 to FIG. 15.

FIG. 10 to FIG. 15 are perspective views illustrating the process steps of making the sensor module A1. Moreover, FIG. 10 to FIG. 15 are simplified to facilitate the understanding, in which the quantities of the electrode pads 11, 21, 34 and bonding wires 4 are reduced.

Figure 10:
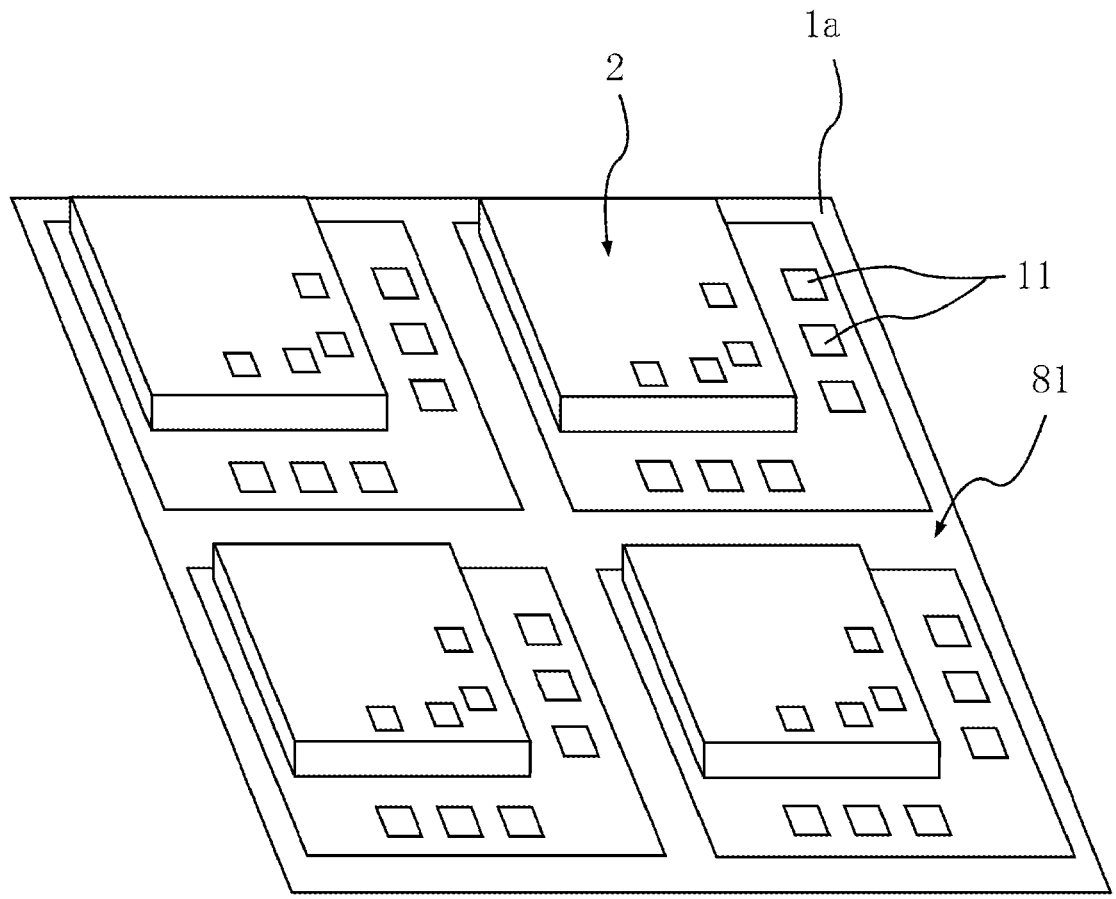
FIG. 10 is a perspective view illustrating the process step of making the sensor module of FIG. 1.
Figure 10:
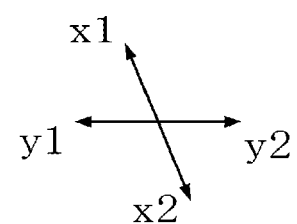

First, a sheet substrate 81 is prepared. The sheet substrate 81 includes various wires such as a wiring pattern 13 and electrode pads 11 formed on a base. In the final step, the sheet substrate 81 is cut into a substrate 1. Also, like the substrate 1, the sheet substrate 81 includes a mounting surface 1a and an installation surface 1b. As illustrated in FIG. 10, an electronic component 2 is mounted at a specific position on the mounting surface 1a of the sheet substrate 81.

Figure 11:
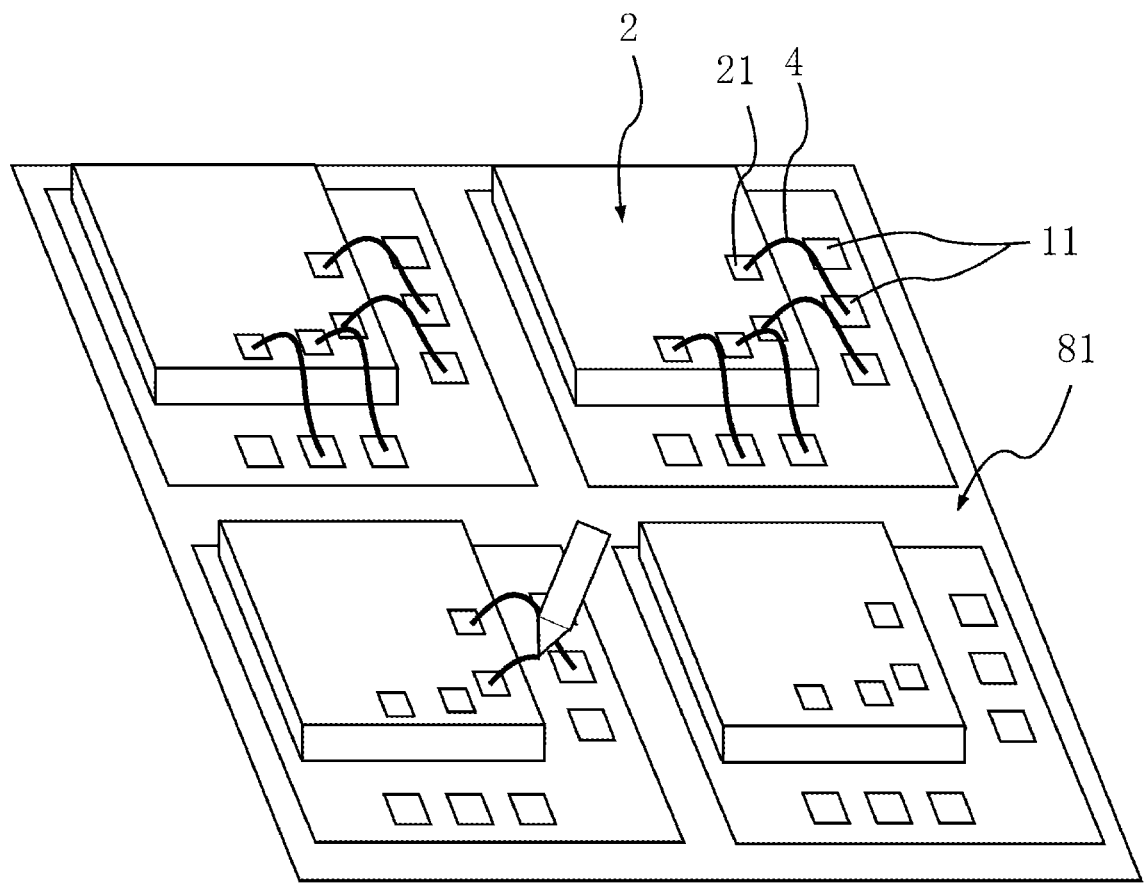
FIG. 11 is a perspective view illustrating the process step of making the sensor module of FIG. 1.
Figure 11:
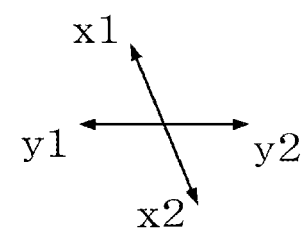

As illustrated in FIG. 11, the electrode pad 21 of the electronic component 2 and the electrode pad 11 of the sheet substrate 81 are connected via the bonding wire 4. In FIG. 11, the wire bonding of the electronic components 2 in the upper left corner and upper right corner is finished, while the wire bonding of the electronic component 2 in the lower left corner is in process.

Figure 12:
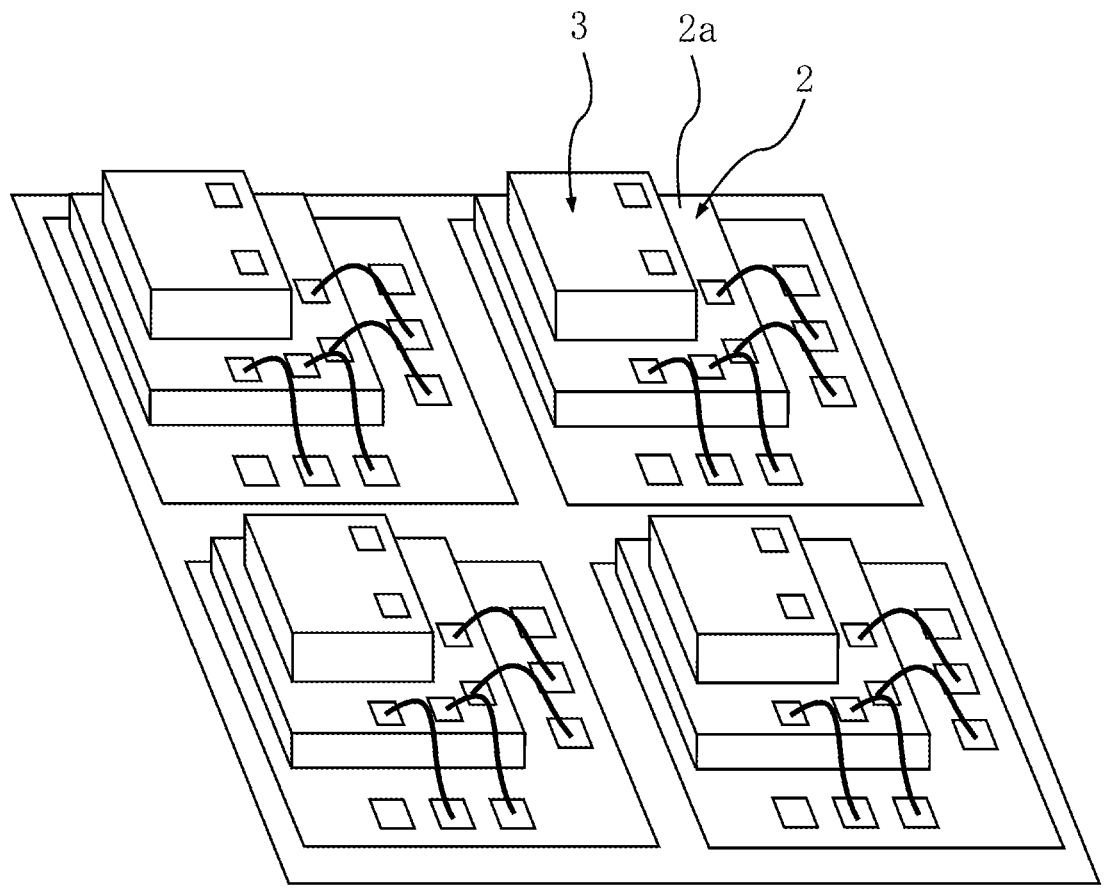
FIG. 12 is a perspective view illustrating the process step of making the sensor module of FIG. 1.
Figure 12:
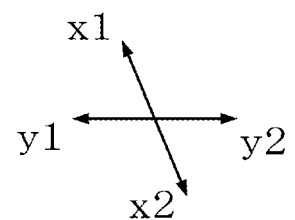

Next, as illustrated in FIG. 12, an atmospheric pressure sensor 3 is mounted at a specific position on the mounting surface 2a of the electronic component 2.

Figure 13:
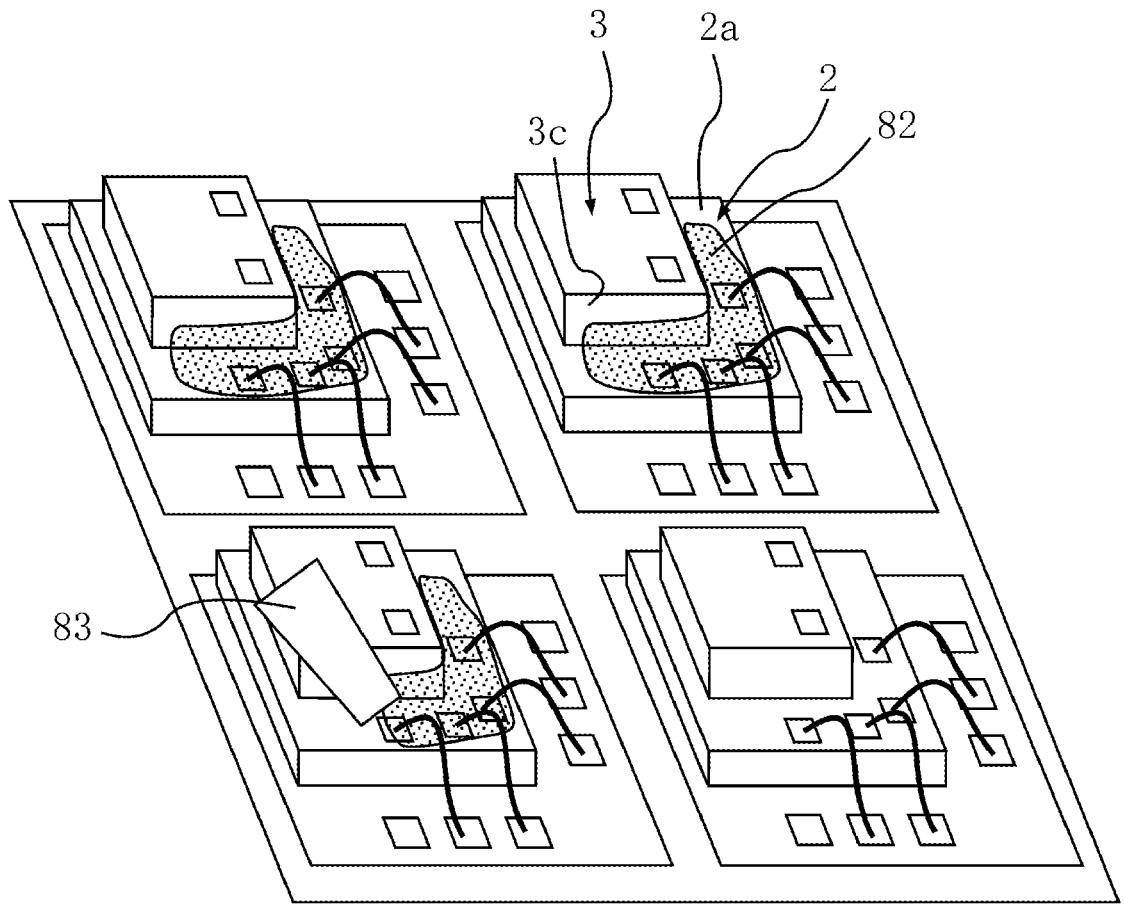
FIG. 13 is a perspective view illustrating the process step of making the sensor module of FIG. 1.

Next, as illustrated in FIG. 13, a silicone paste 82 is applied in such a manner as to continuously cover each electrode pad 21 of the electronic component 2. The silicone paste 82 is a liquid with high viscosity, and is sprayed from a nozzle 83 to cover the electrode pad 21. Also, the silicone paste 82 is applied to be in contact with the side surface 3c of the atmospheric pressure sensor 3, and flows into the gap between the installation surface 3b of the atmospheric pressure sensor 3 and the mounting surface 2a of the electronic component 2. In FIG. 13, the application of the silicone paste 82 to the electronic components 2 in the upper left corner and the upper right corner is complete, whereas the application of the silicone paste 82 to the electronic component 2 in the lower left corner is in process. After the application of the silicone paste 82, the silicone paste 82 is cured, thereby forming a protective member 5.

Figure 14:
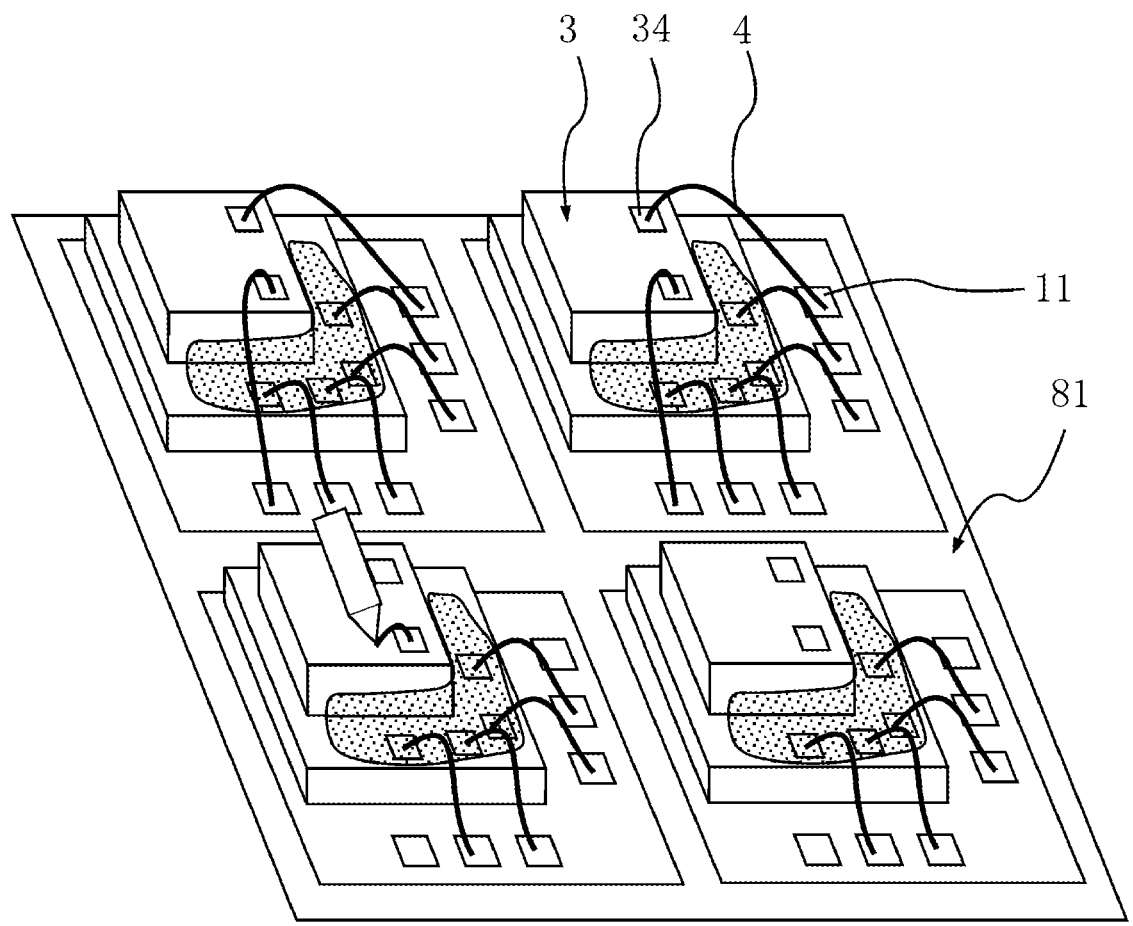
FIG. 14 is a perspective view illustrating the process step of making the sensor module of FIG. 1.

Next, as illustrated in FIG. 14, the electrode pad 34 of the atmospheric pressure sensor 3 and the electrode pad 11 of the sheet substrate 81 are connected with the bonding wire 4. In FIG. 14, the wire bonding of the atmospheric pressure sensors 3 in the upper left corner and upper right corner is finished, while the wire bonding of the atmospheric pressure sensor 3 in the lower left corner is in process.

Figure 15:
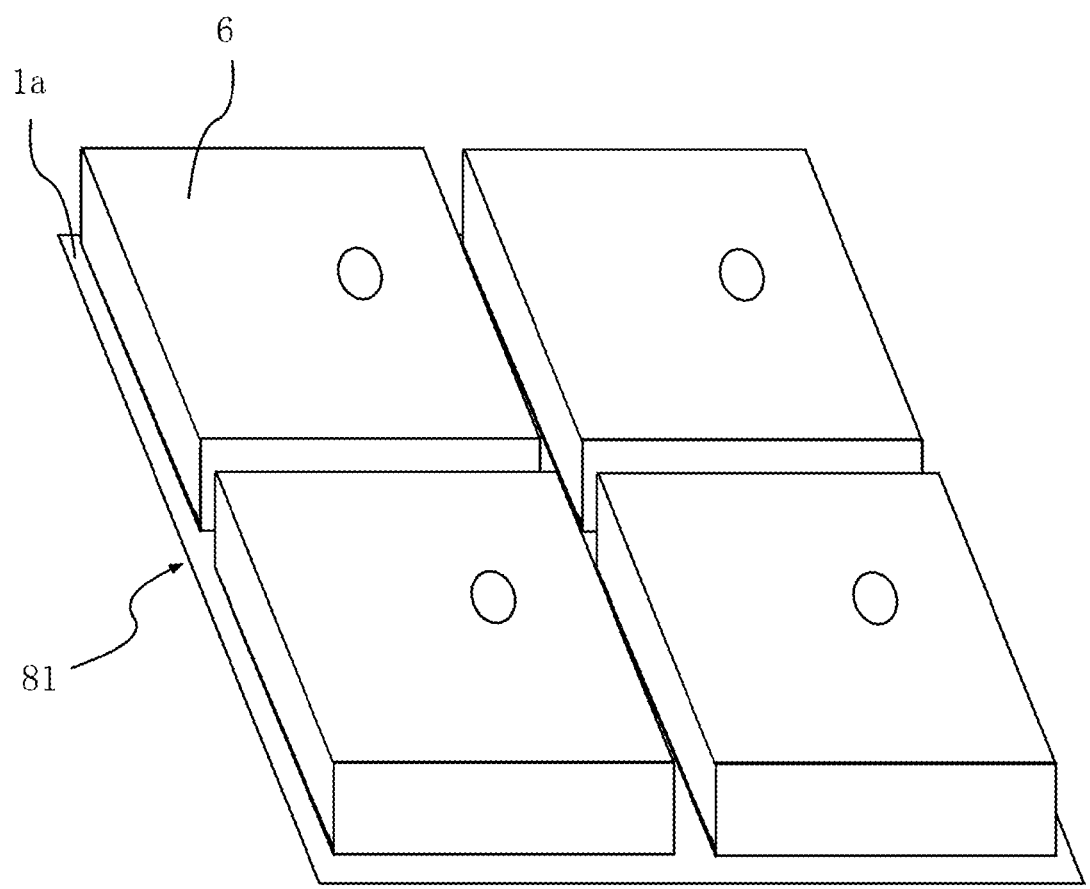
FIG. 15 is a perspective view illustrating the process step of making the sensor module of FIG. 1.
Figure 15:
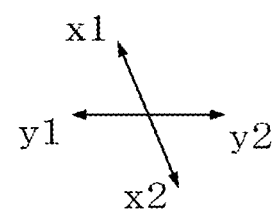

Next, as illustrated in FIG. 15, a cover 6 is fixed onto the mounting surface 1a of the substrate 1 in such a way that the cover 6 surrounds the electronic component 2, the atmospheric pressure sensor 3, the bonding wire 4, and the protective member 5. Thereafter, each sensor module A1 is formed by cutting. The above-mentioned steps are implemented to manufacture the sensor module A1.

The technical effect of the sensor module A1 will now be discussed.

According to the present embodiment, the protective member 5 is formed to cover the electrode pads 21 of the electronic component 2. In this way, when a contaminant such as salt water enters through the opening portion 61, the electrode pads 21 can be protected from being corroded by the salt water. Also, the protective member 5 is formed in such a way that the protective member 5 is in contact with the side surface 3c of the atmospheric pressure sensor 3. Therefore, the atmospheric pressure sensor 3 can be securely fixed onto the electronic component 2, thereby preventing the atmospheric pressure sensor 3 from being separated from the electronic component 2. Further, the protective member 5 is formed in a way such that the protective member 5 is in contact with two side surfaces 3c of the atmospheric pressure sensor 3. Consequently, the atmospheric pressure sensor 3 is fixed more securely onto the electronic component 2.

According to the present embodiment, the protective member 5 extends at least from the joint surface of the silicon substrate 31 and the glass substrate 32 to the z1 direction side on the side surface 3c of the atmospheric pressure sensor 3. Therefore, when there is a gap at the junction of the silicon substrate 31 and the glass substrate 32, the external gas outside of the atmospheric pressure sensor 3 can be prevented from flowing into the chamber 33, thereby maintaining the pressure within the chamber 33. Also, the protective member 5 does not reach the main surface 3a of the atmospheric pressure sensor 3. Hence, it is feasible to avoid the attachment of the protective member 5 to the diaphragm 311, which would result in an inaccurate detection of the atmospheric pressure.

Also, according to the present embodiment, the protective member 5 covers the portion of the bonding wire 4 that tends to break easily, that is, the portion with the maximum curvature. Accordingly, it is possible to avoid the breaking of the bonding wire 4. Also, the protective member 5 includes a mountain-shaped portion 5a that protrudes along the bonding wire 4. Therefore, when the bonding wire 4 is stretched due to the thermal stress of the substrate 1, the stress is alleviated by the mountain-shaped portion 5a of the protective member 5, and the bonding wire 4 is protected from being separated from the electrode pad 21. Also, the portion of the bonding wire 4 that is covered by the protective member 5 is protected from corrosion caused by, for example, salt water. Accordingly, the materials of the bonding wire 4 can be Cu or Al, and the flexibility in selection is therefore increased.

According to the present embodiment, the silicone paste (before being cured to form the protection member 5) flows into the gap between the installation surface 3b of the atmospheric pressure sensor 3 and the mounting surface 2a of the electronic component 2 and is then cured. In this way, the connection between the atmospheric pressure sensor 3 and the electronic component 2 is further increased. The atmospheric pressure sensor 3 and the electronic component 2 are connected through the bonding member. In the gap between the atmospheric pressure sensor 3 and the electronic component 2, the bonding member and the protective member 5 are disposed with a gas layer sandwiched therebetween; the bonding member is formed during the connection of the atmospheric pressure sensor 3 and the electronic component 2 by the application and curing; the protective member 5 is formed from the silicone paste that is applied and cured after the atmospheric pressure sensor 3 and the electronic component 2 are connected. The gas layer makes it difficult for the thermal stress of the substrate 1 to reach the atmospheric pressure sensor 3.

Also, according to the present embodiment, the atmospheric pressure sensor 3 is mounted at a position that is offset in (or proximal to) the x1 direction and the y1 direction with respect to a center of the mounting surface 2a of the electronic component 2. The electrode pads 21 are arranged on the mounting surface 2a at a region to the side in the x2 direction of the atmospheric pressure sensor 3 and the region to the side in the y2 direction of the atmospheric pressure sensor 3. Further, the protective member 5 is formed to cover the two areas. That is, by disposing the protective member 5 over a region of the electronic component 2 that is not disposed with the atmospheric pressure sensor 3, the weight imbalance of the electronic component 2 can be avoided.

Also, according to the present embodiment, the opening portion 61 of the cover 6 is disposed at a position at the side of the z1 direction of the electrode pads 21 of the electronic component 2. The electrode pads 21 are covered by the protective member 5. Accordingly, it is feasible to prevent the salt water or the like that infiltrates through the opening portion 61 from dropping directly onto the electrode pads 21.

FIG. 16 to FIG. 25 illustrate another embodiment of the present invention. Moreover, in these drawings, elements that are the same as or similar to those according to the first embodiment of the present invention are labeled using the reference numbers that are the same as those in the first embodiment of the present invention.

The Second Embodiment of the Present Invention

Figure 16:
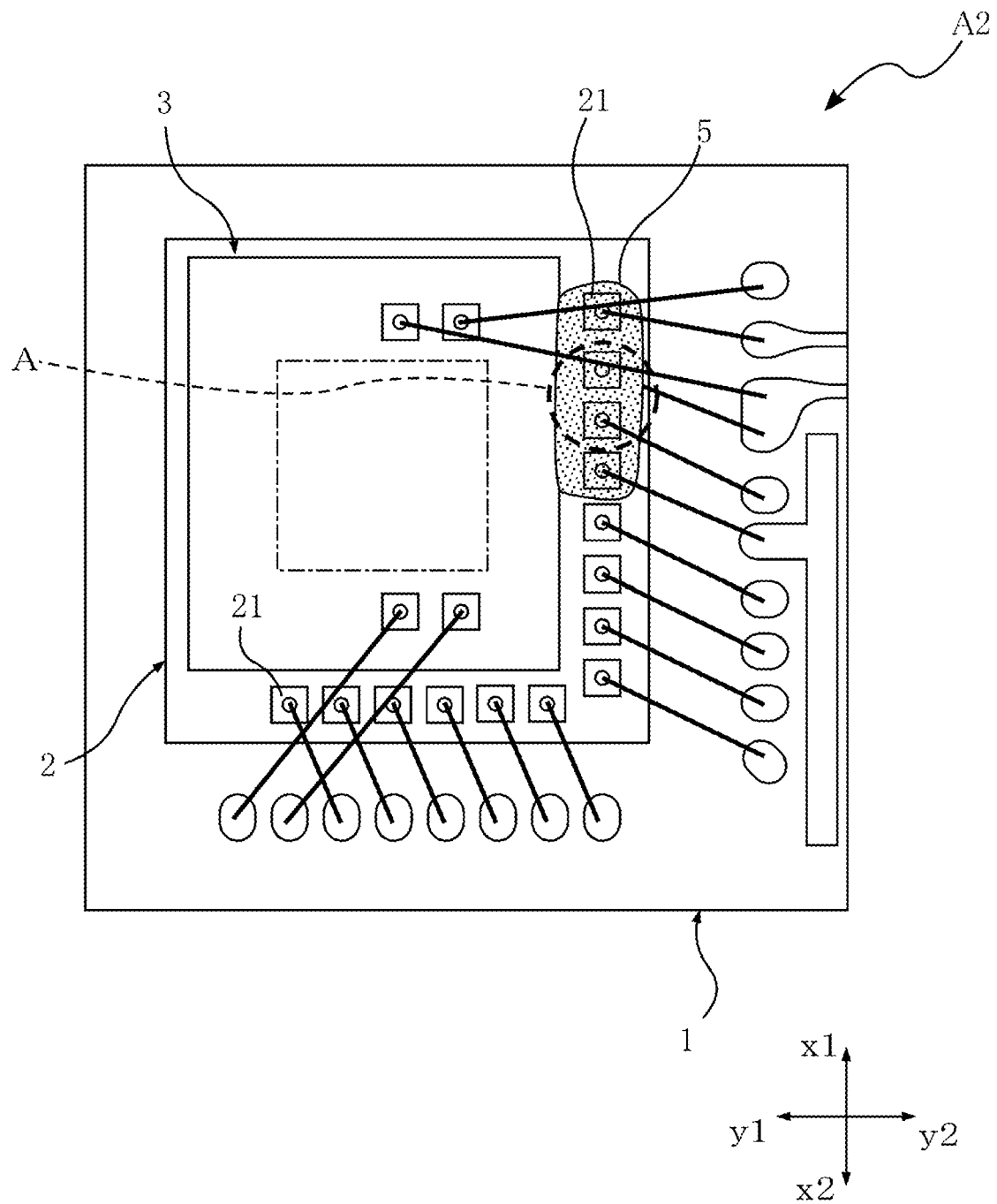
FIG. 16 is a top view of a sensor module according to a second embodiment of the present invention.

FIG. 16 is a top view of the sensor module A2 according to the second embodiment of the present invention. To facilitate the understanding, the cover 6 is omitted in FIG. 16 (the same also applies to FIG. 17, and FIG. 23 to FIG. 25).

The sensor module A2 according to the present embodiment differs from the sensor module A1 in that the protective member 5 covers only a portion of the electrode pads 21, instead of covering all of the electrode pads 21. The dashed-line circle in FIG. 16 indicates the position of the opening portion 61, as viewed from the top. In the sensor module A2, the protective member 5 is formed to cover the electrode pads 21 at the periphery of the circle A (that is, the position adjacent to the opening portion 61).

In the present embodiment, it is feasible to protect the electrode pads 21 that tend to be jeopardized by the salt water or the like infiltrating from the opening portion 61. Furthermore, the present embodiment reduces the size of the protective member 5 used.

Third Embodiment of the Present Invention

Figure 17:
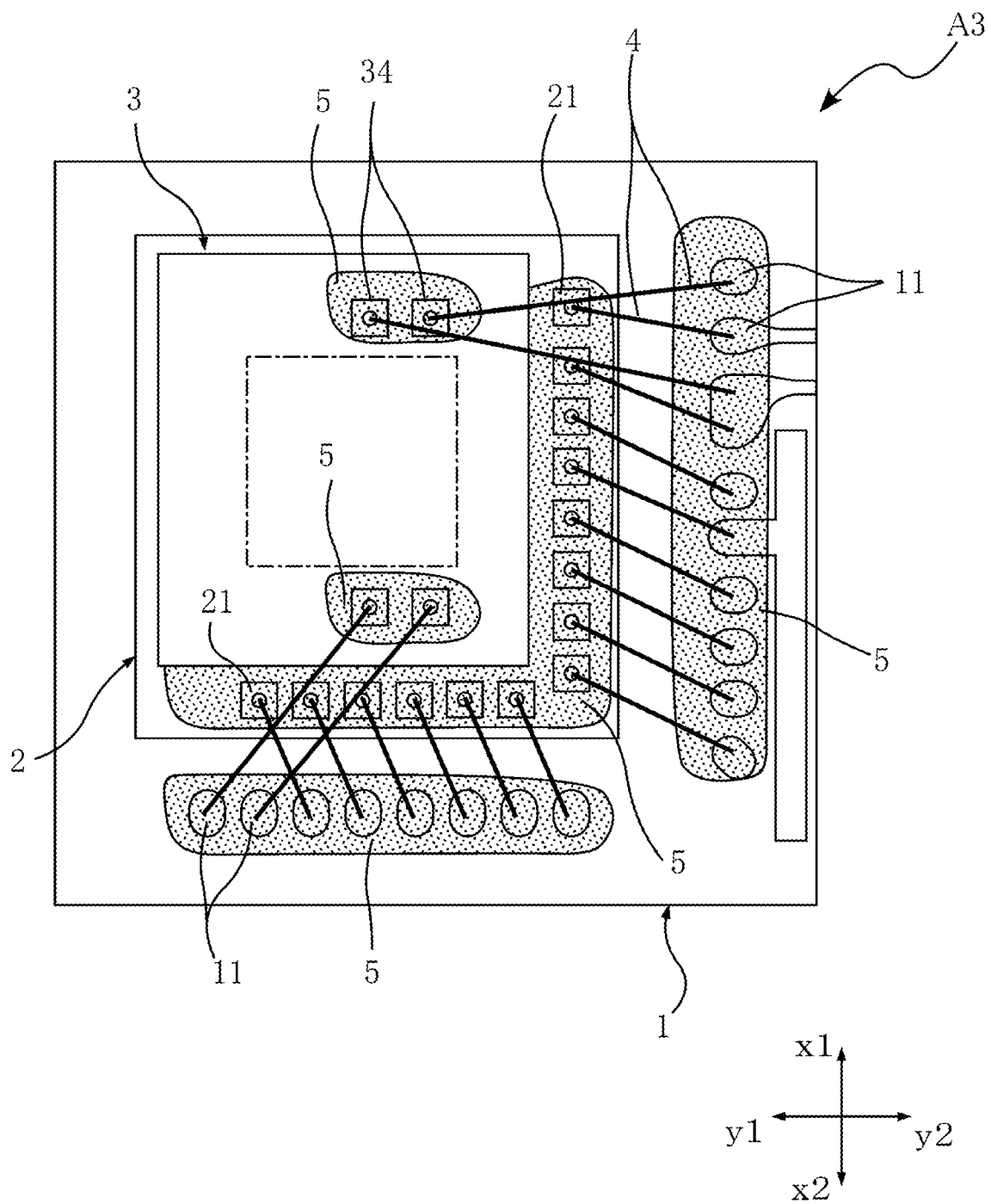
FIG. 17 is a top view of a sensor module according to a third embodiment of the present invention.

FIG. 17 is a top view of the sensor module A3 according to the third embodiment of the present invention.

The sensor module A3 according to the present embodiment differs from the sensor module A1 in that the electrode pads 11 of the substrate 1 and the electrode pads 34 of the atmospheric pressure sensor 3 are respectively covered by the protective member 5. The protective member 5 covering the electrode pads 34 of the atmospheric pressure sensor 3 is formed in a way such that it does not reach the diaphragm 311. The protective member 5 covering the electrode pads 11 corresponds to the "second protective member" according to the present invention, whereas the protective member 5 covering the electrode pads 34 corresponds to the "third protective member" according to the present invention.

In the present embodiment, the electrode pads 11 and electrode pads 34 are protected from corrosion by salt water or other contaminants infiltrating through the opening portion 61. This is particularly effective in cases where the electrode pads 11 or the electrode pads 34 are disposed near the opening portion 61 in the top view, or in the cases where the electrode pads 11 or the electrode pads 34 are made of a metal (for example, Al or Al alloy) that is easily corroded by salt water.

Moreover, instead of covering both the electrode pads 11 of the substrate 1 and the electrode pads 34 of the atmospheric pressure sensor 3, it is alternatively possible to cover only one of the two with the protective member 5. Further, it is also possible that all of the electrode pads 11 of the substrate 1 (or, all of the electrode pads 34 of the atmospheric pressure sensor 3) are not covered by the protective member 5. It is also feasible to determine the region covered by the protective member 5 depending on the position of the opening portion 61.

The Fourth Embodiment of the Present Invention

Figure 18:
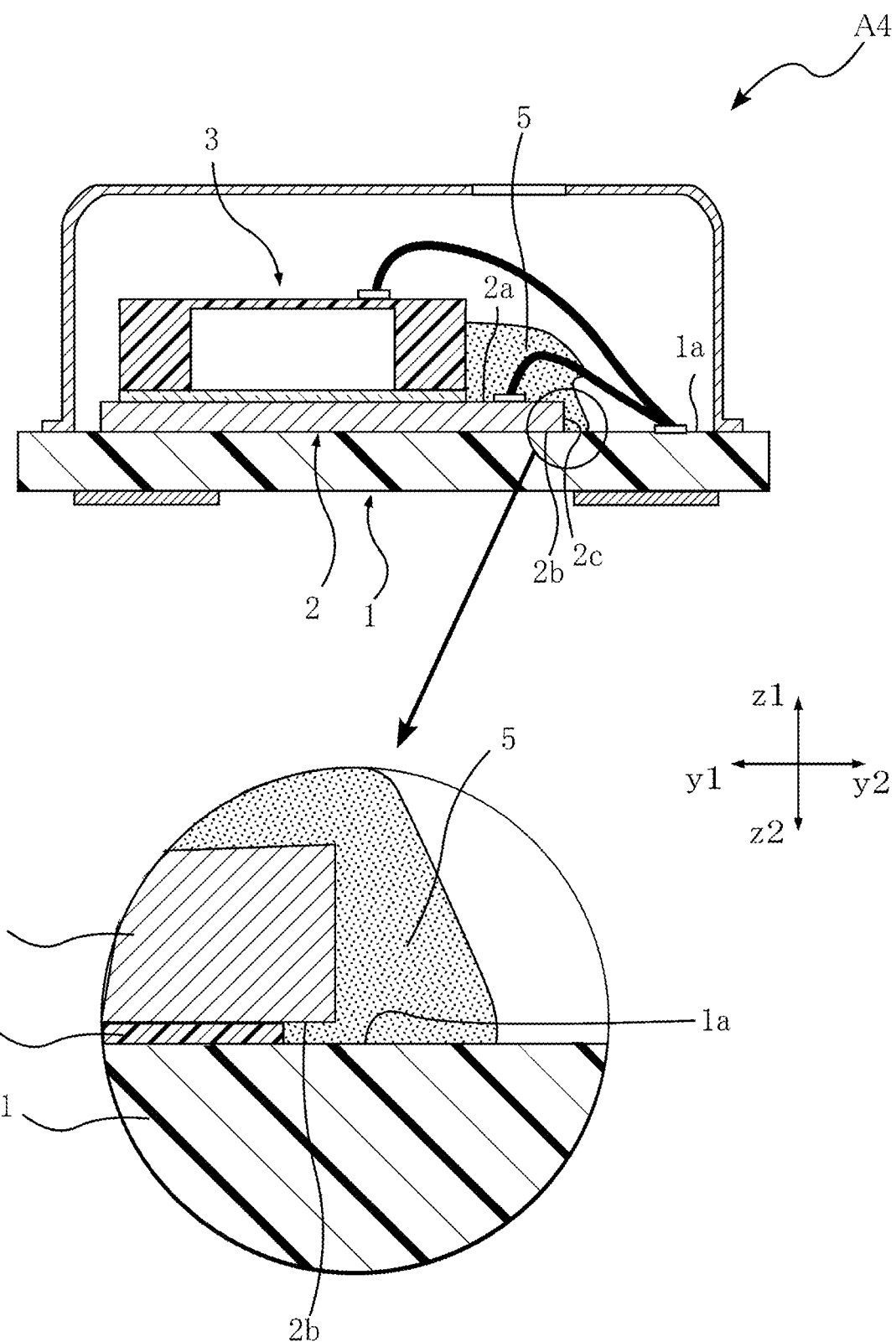
FIG. 18 is a cross-sectional view of a sensor module according to a fourth embodiment of the present invention.

FIG. 18 is a cross-sectional view of the sensor module A4 according to the fourth embodiment of the present invention. FIG. 18 is equivalent to FIG. 3, which is the cross-sectional view of the sensor module A1 according to the first embodiment of the present invention (the same also applies in FIG. 22).

The sensor module A4 of the present embodiment differs from the sensor module A1 in that the protective member 5 extends to the mounting surface 1a of the substrate 1. As illustrated in the close-up view of the main component provided at the lower portion of FIG. 18, the electronic component 2 is mounted on the substrate 1 by connecting the installation surface 2b of the electronic component 2 to the mounting surface 1a of the substrate 1 with a die attachment film 7. As a result, there is a gap between the installation surface 2b and the mounting surface 1a. The protection member 5 is also formed in the gap.

Figure 19:
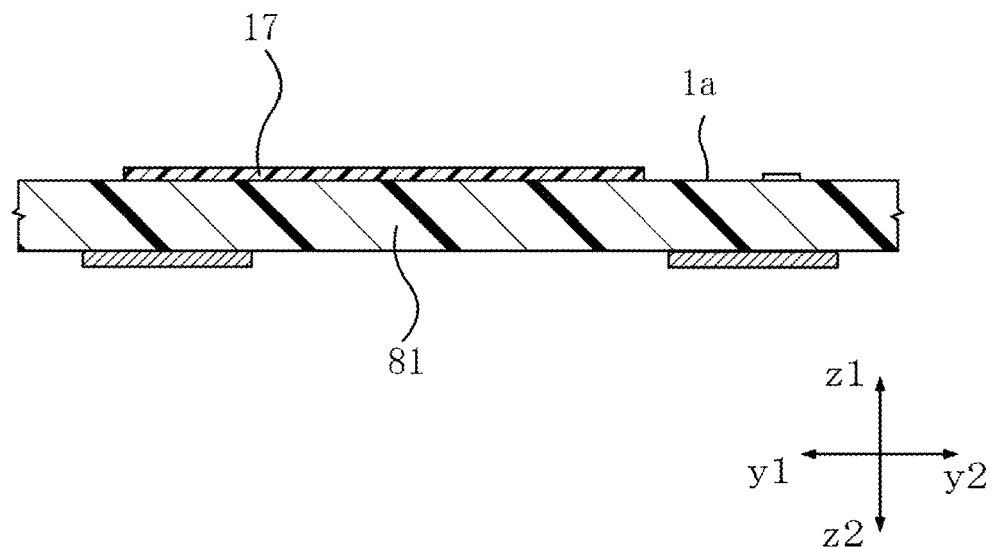
FIG. 19 is a cross-sectional view illustrating the process step of making the sensor module of FIG. 18.
Figure 20:
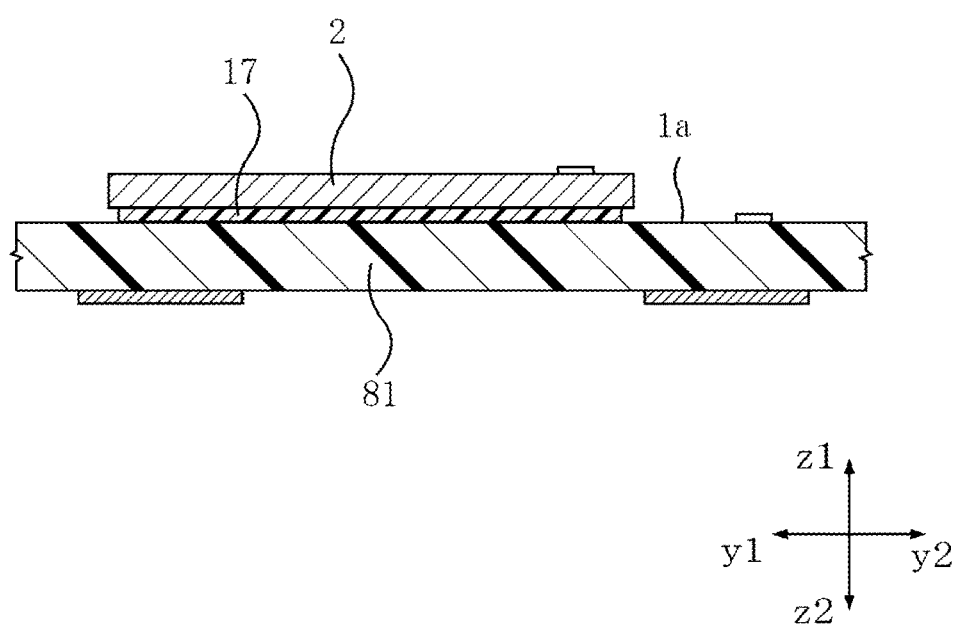
FIG. 20 is a cross-sectional view illustrating the process step of making the sensor module of FIG. 18.
Figure 21:
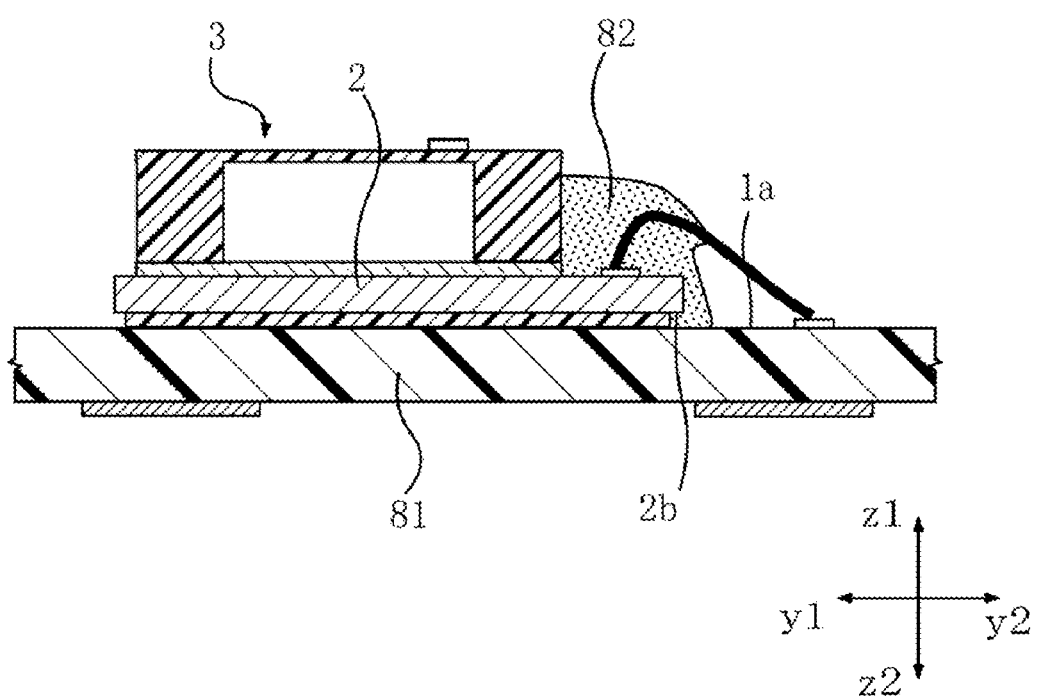
FIG. 21 is a cross-sectional view illustrating the process step of making the sensor module of FIG. 18.

FIG. 19 to FIG. 21 are cross-sectional views illustrating the process steps for the manufacture of the sensor module A4. In FIG. 19 to FIG. 21, the portion corresponding to one sensor module A4 in each step is illustrated in a cross-sectional view corresponding to FIG. 18.

FIG. 19 illustrates a step preceding the step shown in FIG. 10, wherein the die attachment film 7 is disposed at a specific position on the mounting surface 1a of the sheet substrate 81. Moreover, the step is the same as the equivalent step of the first embodiment.

FIG. 20 illustrates a step that is the same as the step illustrated in FIG. 10, wherein the electronic component 2 is disposed on the die attachment film 7, and the electronic component 2 is mounted on the mounting surface 1a of the sheet substrate 81. Moreover, the step is also the same as the equivalent step of the first embodiment of the present invention.

FIG. 21 illustrates a step that is the same as the step illustrated in FIG. 13, wherein the silicone paste 82 is applied in a way such that the silicone paste 82 continuously covers each electrode pad 21 of the electronic component 2. The present embodiment differs from the first embodiment of the present invention (shown in FIG. 13) in that the silicone paste 82 is applied in such a way that the silicone paste 82 reaches the mounting surface 1a of the sheet substrate 81. Due to the flowability of the silicone paste 82, the silicone paste 82 flows into the gap between the installation surface 2b of the electronic component 2 and the mounting surface 1a of the substrate 1.

Accordingly, in the sensor module A4, as illustrated in FIG. 18, the protective member 5 is also formed in the gap of the junction of the installation surface 2b and the mounting surface 1a.

In the present embodiment, the protective member 5 extends to the mounting surface 1a of the substrate 1. Further, the protective member 5 is also formed in the gap of the junction of the installation surface 2b of the electronic component 2 and the mounting surface 1a of the substrate 1. Therefore, the electronic component 2 is fixed on the substrate 1 more securely than in the sensor module A1, and hence, the electronic component 2 can be prevented from being separated from the substrate 1. Also, it is feasible to prevent the salt water or the like that infiltrates the sensor module A4 from entering the gap at the junction of the installation surface 2b of the electronic component 2 and the mounting surface 1a of the substrate 1. Therefore, the die attachment film 7 that connects the electronic component 2 and the substrate 1 is prevented from being corroded by salt water or the like.

The Fifth Embodiment of the Present Invention

Figure 22:
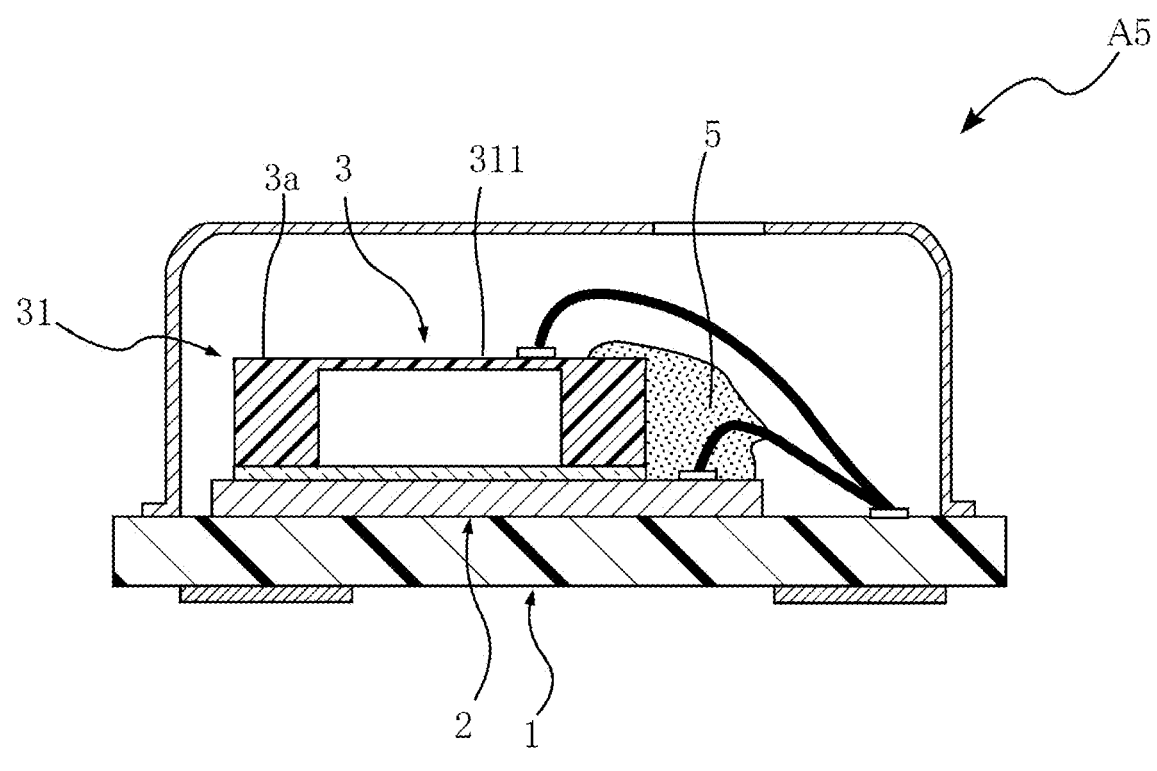
FIG. 22 is a cross-sectional view of a sensor module according to a fifth embodiment of the present invention.

FIG. 22 is a cross-sectional view illustrating a sensor module A5 according to the fifth embodiment of the present invention.

The sensor module A5 of the present embodiment differs from the sensor module A1 in that the protective member 5 extends to the main surface 3a of the atmospheric pressure sensor 3. The protective member 5 does not reach the circuit portion of the main surface 3a.

In the present embodiment, the protective member 5 extends to the main surface 3a of the atmospheric pressure sensor 3. As a result, the atmospheric pressure sensor 3 is fixed on the electronic component 2 more securely than in the sensor module A1, and the atmospheric pressure sensor 3 is prevented from being separated from the electronic component 2. Moreover, the protective member 5 can also cover the circuit portion, as long as the protective member 5 does not reach the diaphragm 311.

The Sixth Embodiment of the Present Invention

Figure 23:
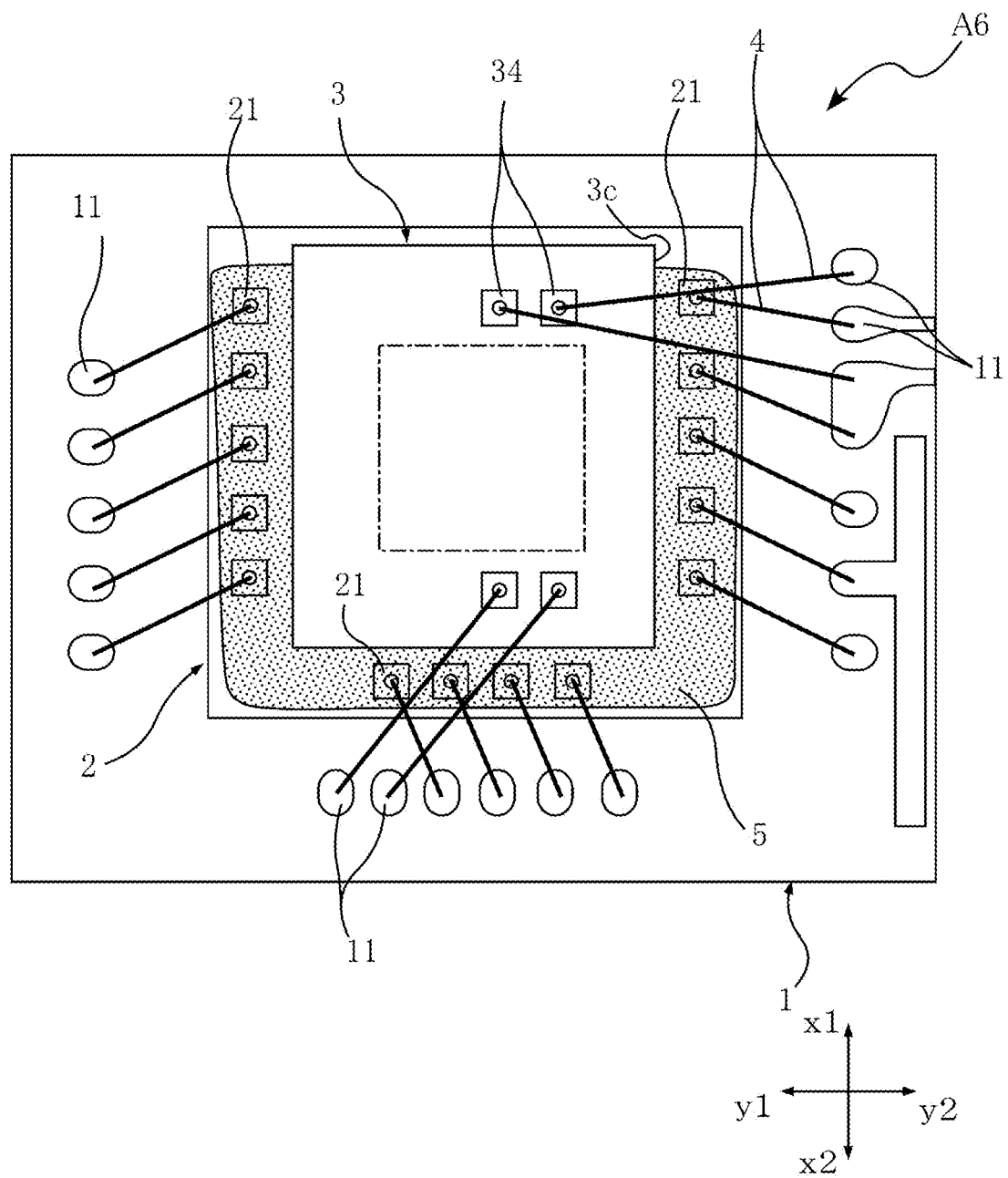
FIG. 23 is a top view of a sensor module according to a sixth embodiment of the present invention.

FIG. 23 is a top view of a sensor module A6 according to the sixth embodiment of the present invention.

The sensor module A6 of the present embodiment differs from the sensor module A1 in that the position at which the electronic component 2 is mounted on the mounting surface 1a of the substrate 1 and the position at which the atmospheric pressure sensor 3 is mounted on the mounting surface 2a of the electronic component 2 are different from those in the first embodiment. The electronic component 2 is disposed at a position offset in (or proximal to) the x1 direction with respect to a center of the mounting surface 1a of the substrate 1; yet in the y1-y2 direction, it is mounted at the center. In addition, the atmospheric pressure sensor 3 is similarly disposed at a position that is offset in (or proximal to) the x1 direction with respect to the center of the mounting surface 2a of the electronic component 2; yet in the y1-y2 direction, it is mounted at the center. Furthermore, the electrode pads 11 of the substrate 1 are arranged on the mounting surface 1a at a region at the side of the x2 direction, a region at the side of the y1 direction, and a region at the side of the y2 direction of the electronic component 2. Also, the electrode pads 21 of the electronic component 2 are arranged on the mounting surface 2a at a region at the side of the x2 direction, a region at the side of the y1 direction, and a region at the side of the y2 direction of the atmospheric pressure sensor 3. The protective member 5 is formed to cover the three regions.

In the present embodiment, the protective member 5 is formed in such a way that the protective member 5 is in contact with the three side surfaces 3c of the atmospheric pressure sensor 3. Therefore, the atmospheric pressure sensor 3 is fixed on the electronic component 2 more securely than the sensor module A1, and hence, the atmospheric pressure sensor 3 is prevented from being separated from the electronic component 2. In addition, the protective member 5 covers a larger area of the junction of the silicon substrate 31 and the glass substrate 32 of the atmospheric pressure sensor 3. Consequently, even when there is a gap at the junction of the silicon substrate 31 and the glass substrate 32, it is more likely to maintain the pressure within the chamber 33 than the case in the sensor module A1. Also, as compared with the case of the sensor module A1, the flexibility of the arrangement of electrode pads 11, 21 is greater, and the flexibility of the wiring patterns of the substrate 1 and the electronic component 2 is also greater.

Moreover, there is no limitation regarding the position at which the electronic component 2 is mounted on the mounting surface 1a of the substrate 1 or the position at which the atmospheric pressure sensor 3 is mounted on the mounting surface 2a of the electronic component 2. In addition, the arrangements and positions of the electrode pads 11 and electrode pads 21 are also not particularly limited. For example, the electronic component 2 can be mounted at the center of the mounting surface 1a of the substrate 1, the atmospheric pressure sensor 3 can be mounted at the center of the mounting surface 2a of the electronic component 2, the electrode pads 11 can be arranged around the periphery of the electronic component 2, and the electrode pads 21 can be arranged around the periphery of the atmospheric pressure sensor 3. In these cases, the protective member 5 covering the electrode pads 21 is formed in such a way that the protective member 5 is in contact with the four side surfaces 3c of the atmospheric pressure sensor 3. Hence, the atmospheric pressure sensor 3 can be fixed securely on the electronic component 2, thereby preventing the atmospheric pressure sensor 3 from being separated from the electronic component 2. Also, the protective member 5 covers the full extent of the junction of the silicon substrate 31 and the glass substrate 32 of the atmospheric pressure sensor 3. In this way, when there is a gap formed at the junction between the silicon substrate 31 and the glass substrate 32, it is also possible to maintain the pressure within the chamber 33. In addition, the arrangement of the electrode pads 11 and 21 and the wiring patterns of the substrate 1 and the electronic component 2 are more flexible. On the other hand, the areas of the mounting surface 1a of the substrate 1 and the mounting surface 2a of the electronic component 2 become bigger. The sensor module A1 is advantageous from the aspect of miniaturization.

The Seventh Embodiment of the Present Invention

Figure 24:
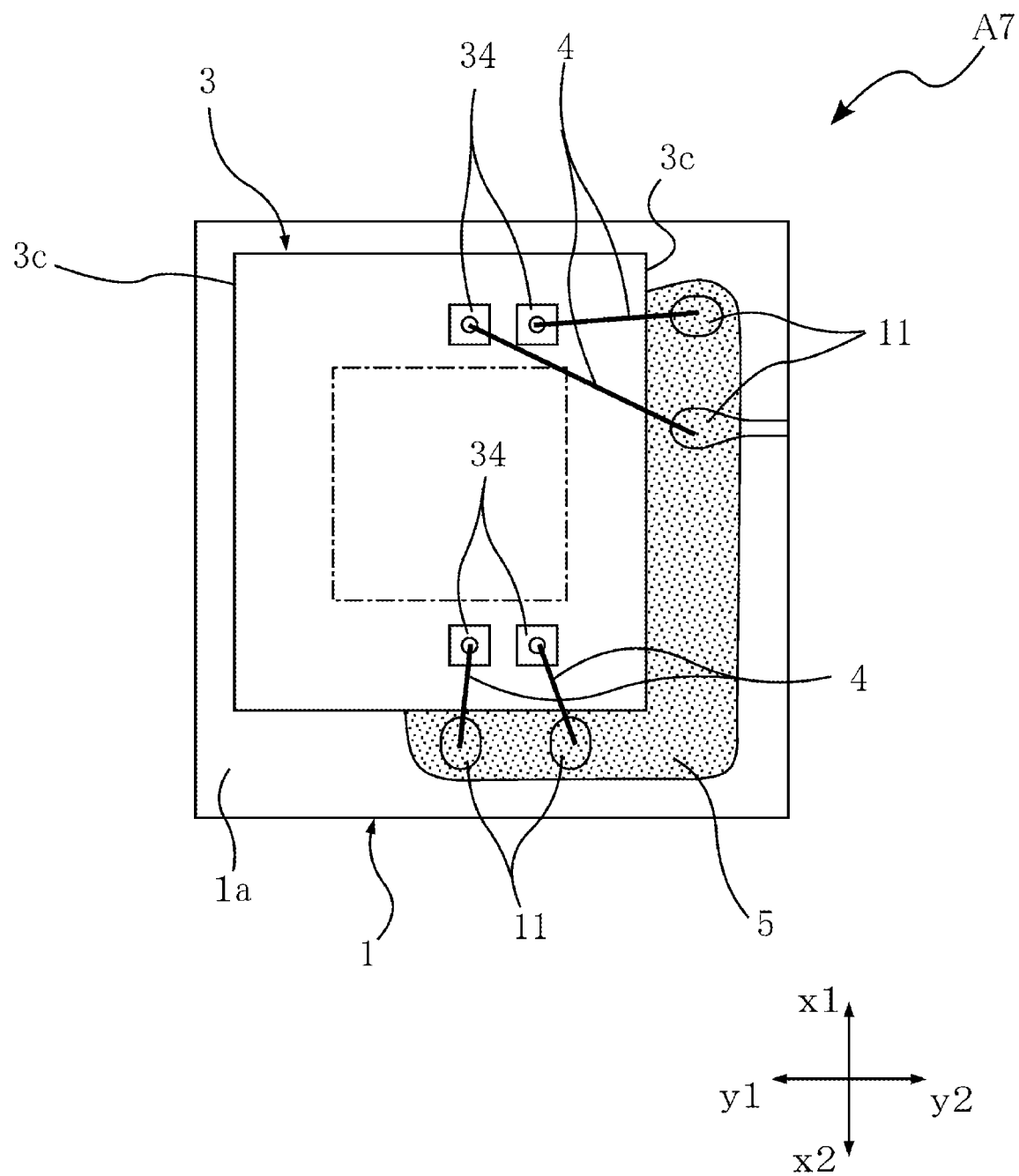
FIG. 24 is a top view of a sensor module according to a seventh embodiment of the present invention.

FIG. 24 is a top view of a sensor module A7 according to the seventh embodiment of the present invention.

The sensor module A7 of the present embodiment differs from the sensor module A1 in that the sensor module A7 does not comprise the electronic component 2. The atmospheric pressure sensor 3 is mounted on the mounting surface 1a of the substrate 1. The sensor module A7 outputs the electric signal detected by the atmospheric pressure sensor 3 directly, without processing the signal. Therefore, in the cases where the sensor module A1 is installed on the circuit board of various electronic devices, it is also required to install the electric component(s) for signal processing (equivalent to the electronic component 2) on the circuit board. The electrode pads 34 of the atmospheric pressure sensor 3 are connected to the electrode pads 11 of the substrate 1 via the bonding wire 4. The protective member 5 is formed to cover the electrode pads 11 of the substrate 1. In the present embodiment, "substrate 1" corresponds to the "substrate" according to the present invention, and "electrode pads 11" correspond to the "electrodes" according to the present invention.

In the present embodiment, the protective member 5 is formed to cover the electrode pads 11 of the substrate 1. Therefore, when contaminants such as salt water infiltrate through the opening portion 61, the electrode pads 11 are protected from being corroded by salt water or the like. Also, the protective member 5 is formed to contact the side surface 3c of the atmospheric pressure sensor 3. Therefore, the atmospheric pressure sensor 3 can be securely fixed onto the substrate 1, thereby preventing the atmospheric pressure sensor 3 from being separated from the substrate 1. Furthermore, the protective member 5 is formed to be in contact with the two side surfaces 3c of the atmospheric pressure sensor 3. Hence, the atmospheric pressure sensor 3 is fixed more securely onto the substrate 1.

According to the present embodiment, the silicone paste (before being cured into the protection member 5) also flows into the gap between the installation surface 3b of the atmospheric pressure sensor 3 and the mounting surface 1a of the substrate 1, and is then cured. In this way, the connection between the atmospheric pressure sensor 3 and the substrate 1 is made more secure. The atmospheric pressure sensor 3 and the substrate 1 are connected with the bonding member. In the gap between the atmospheric pressure sensor 3 and the substrate 1, the bonding member and the protection member 5 are disposed with a gas layer sandwiched therebetween; the bonding member is formed during the connecting step of the atmospheric pressure sensor 3 and the substrate 1 by application and curing; and the protective member 5 is formed from the silicone paste that is applied and cured after the atmospheric pressure sensor 3 and the substrate 1 are connected. The gas layer makes it more difficult for the thermal stress of the substrate 1 to be delivered to the atmospheric pressure sensor 3.

According to the present embodiment, the atmospheric pressure sensor 3 is mounted at a position that is offset in (or proximal to) the x1 direction and y1 direction with respect to a center of the mounting surface 1a of the substrate 1, and electrode pads 11 are arranged on the mounting surface 1a at a region at the side of the x2 direction of the atmospheric pressure sensor 3 and a region at the side of the y2 direction of the atmospheric pressure sensor 3. Further, the protective member 5 is formed by covering the two areas. That is, by disposing the protective member 5 at a region of the substrate 1 that is not disposed with the atmospheric pressure sensor 3, the weight imbalance of the substrate 1 is avoided.

According to the present embodiment, the opening portion 61 of the cover 6 is disposed at a position at the side of the z1 direction of the electrode pads 11 of the substrate 1. The electrode pads 11 are covered by the protective member 5. Accordingly, the salt water or other contaminant that infiltrates the electronic component 2 through the opening portion 61 is prevented from dropping directly onto the electrode pads 11.

The Eighth Embodiment of the Present Invention

Figure 25:
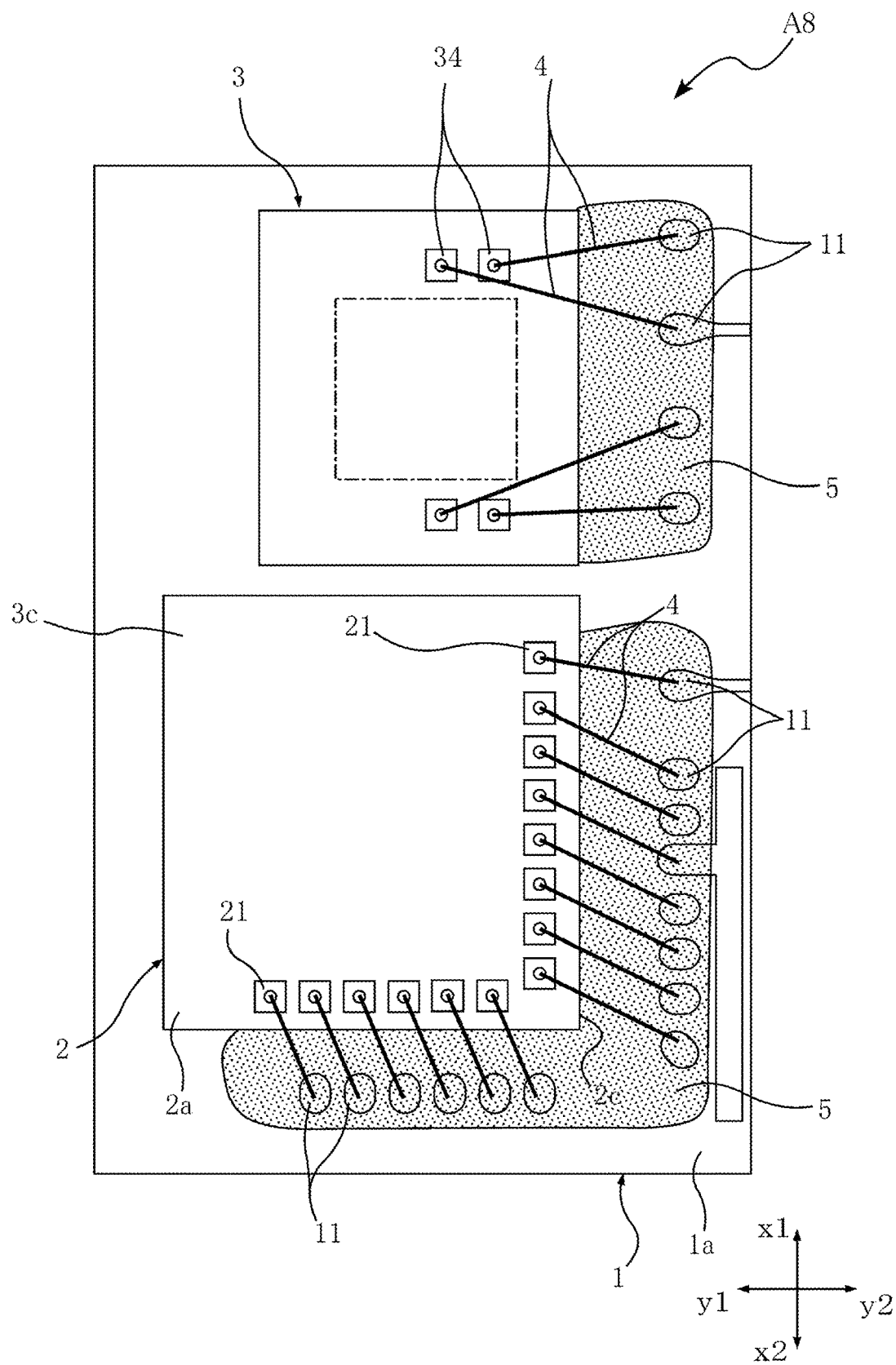
FIG. 25 is a top view of a sensor module according to an eighth embodiment of the present invention.

FIG. 25 is a top view of a sensor module A8 according to the eighth embodiment of the present invention.

The sensor module A8 of the present embodiment differs from the sensor module A1 in that the atmospheric pressure sensor 3 is not mounted on the electronic component 2, but is instead mounted on the substrate 1. The electrode pads 34 of the atmospheric pressure sensor 3 are connected to the electrode pads 11 of the substrate 1 using the bonding wire 4. The protective member 5 is formed to cover the electrode pads 11 of the substrate 1. In the present embodiment, the "substrate 1" corresponds to the "substrate" according to the present invention, and the "electrode pad 11" corresponds to the "electrode" according to the present invention.

In the present embodiment, it is also feasible to attain the technical effect as the seventh embodiment of the present invention does.

Moreover, in the first to the eighth embodiments of the present invention, the sensor modules A1 to A8 are described with reference to the atmospheric pressure sensor 3 mounted therein; however, the present invention is not limited thereto. For example, it is also possible to mount a temperature sensor or a humidity sensor instead of the atmospheric pressure sensor 3. Also, it is possible to mount a sensor for detecting gas or microparticles, such a gas sensor or an alcohol sensor.

The present sensor module and method of making the same are not limited to the above-mentioned embodiments of the present invention. The specific components of each part of the present sensor module and method of making the same can be varied or altered in various ways.

What is claimed is:

1. A sensor module, comprising:
a substrate having a substrate main surface and a substrate back surface facing opposite sides, wherein the substrate main surface is disposed with an electrode;
a sensor having a sensor main surface and a sensor back surface facing opposite sides and having a sensor side surface connecting the sensor main surface and the sensor back surface, wherein the sensor is mounted on the substrate main surface with the sensor back surface facing the substrate;
a bonding wire connected to the electrode; and
a first protective member covering the electrode,
wherein the first protective member exposes a portion of the bonding wire and is in contact with the sensor side surface,
wherein the sensor comprises a sensor electrode formed on the sensor main surface, and the sensor module further comprises a second protective member covering the sensor electrode,
the second protective member unreaches a diaphragm of the sensor.

2. The sensor module of claim 1, wherein the first protective member continuously covers from the electrode to a maximum curvature portion of the bonding wire.

3. The sensor module of claim 1, wherein the sensor comprises a support portion having a recess and a cover covering an opening of the support portion.

4. The sensor module of claim 3, wherein the first protective member covers at least a portion of a junction between the support portion and the cover.

5. The sensor module of claim 1, wherein the first protective member exposes at least a portion of the sensor main surface.

6. The sensor module of claim 1, wherein the sensor comprises a circuit formed on the sensor main surface, and the first protective member exposes the circuit.

7. The sensor module of claim 1, wherein the sensor comprises a hollow portion, and the first protective member exposes a region of the sensor main surface where the hollow portion is located from top view.

8. The sensor module of claim 1, wherein the first protective member comprises a portion between the substrate main surface and the sensor back surface.

9. The sensor module of claim 1, wherein the first protective member covers a portion of each of at least two consecutive sensor side surfaces.

10. The sensor module of claim 1, wherein the first protective member comprises a mountain-shaped portion protruding along the bonding wire in a direction away from the electrode of the substrate.

11. The sensor module of claim 1, wherein the substrate comprises four substrate side surfaces connecting the substrate main surface and the substrate back surface, the sensor is mounted proximal to two consecutive substrate side surfaces with respect to a center of the substrate main surface, the electrode is disposed on the substrate main surface in an electrode arranging region proximal to two consecutive substrate side surfaces different from the two substrate side surfaces, and the first protective member covers the electrode arranging region.

12. The sensor module of claim 1, wherein the first protective member comprises silicone resin.

13. The sensor module of claim 1, further comprising a bonding member bonding the substrate and the sensor, and the first protective member comprises the same material as the bonding member.

14. The sensor module of claim 1, wherein the electrode comprises aluminum or aluminum alloy.

15. The sensor module of claim 1, wherein the substrate is an electronic component.

16. The sensor module of claim 1, further comprising a second substrate having a second substrate main surface and a second substrate back surface facing opposite sides and a second electrode is provided on the second substrate main surface, and the substrate is mounted on the second substrate main surface.

17. The sensor module of claim 16, wherein the second substrate comprises four second substrate side surfaces connecting the second substrate main surface and the second substrate back surface, the substrate is mounted proximal to two consecutive second substrate side surfaces with respect to a center of the second substrate main surface, and the second electrode is provided on the second substrate main surface in a second electrode arranging region proximal to two consecutive second substrate side surfaces different from the two second substrate side surfaces.

18. The sensor module of claim 16, wherein the first protective member continuously covers the second substrate main surface.

19. The sensor module of claim 16, further comprising a third protective member covering the second electrode.

20. The sensor module of claim 1, further comprising an electronic component mounted on the substrate main surface.

21. The sensor module of claim 1, further comprising a box-shaped member surrounding the sensor, the bonding wire, and the first protective member.

22. The sensor module of claim 21, wherein the box-shaped member is provided with an opening portion.

23. The sensor module of claim 22, wherein a plurality of the electrodes are disposed, and at least the electrode which appears closest to the opening portion in top view is covered by the first protective member.

24. The sensor module of claim 21, wherein the box-shaped member comprises metal.

25. The sensor module of claim 1, wherein the sensor is an atmospheric pressure sensor.

26. A method of making a sensor module, comprising:
- a first step of preparing a sheet substrate having a main surface and a back surface facing opposite sides, wherein the main surface is provided with a substrate electrode;
- a second step of mounting an electronic component provided with an electronic component electrode on the main surface of the sheet substrate;
- a third step of connecting the substrate electrode and the electronic component electrode with a bonding wire;
- a fourth step of mounting a sensor on a surface of the electronic component opposite to the sheet substrate, wherein the sensor comprises a sensor main surface and a sensor back surface facing opposite sides and a sensor side surface connecting the sensor main surface and the sensor back surface, and the sensor main surface is provided with a sensor electrode;
- a fifth step of forming a first protective member by applying a silicone paste to cover the electronic component electrode and to contact the sensor side surface, and curing the silicone paste;
- a sixth step of connecting the sensor electrode and the substrate electrode with a bonding wire;
- a seventh step of forming a second protective member to cover the sensor electrode; and
- an eighth step of fixing a box-shaped cover to the main surface of the sheet substrate to surround the electronic component, the sensor, the bonding wires, and the first protective member,
- wherein the second protective member unreaches a diaphragm of the sensor.

* * * * *